(12) United States Patent
Chuang et al.

(10) Patent No.: US 11,018,113 B2
(45) Date of Patent: May 25, 2021

(54) MEMORY MODULE, SEMICONDUCTOR PACKAGE INCLUDING THE SAME, AND MANUFACTURING METHOD THEREOF

(71) Applicant: Taiwan Semiconductor Manufacturing Co., Ltd., Hsinchu (TW)

(72) Inventors: Lipu Kris Chuang, Hsinchu (TW); Chung-Hao Tsai, Changhua County (TW); Hsin-Yu Pan, Taipei (TW); Yi-Che Chiang, Hsinchu (TW); Chien-Chang Lin, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 81 days.

(21) Appl. No.: 16/655,237

(22) Filed: Oct. 17, 2019

(65) Prior Publication Data

US 2021/0118847 A1 Apr. 22, 2021

(51) Int. Cl.
*H01L 25/065* (2006.01)
*H01L 23/31* (2006.01)
(Continued)

(52) U.S. Cl.
CPC ...... *H01L 25/0652* (2013.01); *H01L 21/4857* (2013.01); *H01L 21/4871* (2013.01);
(Continued)

(58) Field of Classification Search
CPC ............... H01L 25/0652; H01L 25/043; H01L 25/0657; H01L 25/50; H01L 25/071;
(Continued)

(56) References Cited

U.S. PATENT DOCUMENTS 9,000,584 B2 4/2015 Lin et al.
9,048,222 B2 6/2015 Hung et al.
(Continued)

*Primary Examiner* — Jose R Diaz
(74) *Attorney, Agent, or Firm* — JCIPRNET

(57) ABSTRACT

A memory module includes a first redistribution structure, a second redistribution structure, first semiconductor dies, second semiconductor dies, an encapsulant, through insulator vias and thermally conductive material. Second redistribution structure is stacked over first redistribution structure. First semiconductor dies are sandwiched between first redistribution structure and second redistribution structure and disposed side by side. Second semiconductor dies are disposed on the second redistribution structure. The encapsulant laterally wraps the second semiconductor dies. The through insulator vias are disposed among the first semiconductor dies, extending from the first redistribution structure to the second redistribution structure. The through insulator vias are electrically connected to the first redistribution structure and the second redistribution structure. The thermally conductive material is disposed on the second redistribution structure, among the second semiconductor dies and overlying the through insulator vias. The thermally conductive material has a thermal conductivity larger than that of the encapsulant.

20 Claims, 19 Drawing Sheets

(51) Int. Cl.
  *H01L 23/373* (2006.01)
  *H01L 21/48* (2006.01)
  *H01L 25/00* (2006.01)
  *H01L 21/56* (2006.01)
  *H01L 23/367* (2006.01)

(52) U.S. Cl.
  CPC .......... *H01L 21/56* (2013.01); *H01L 23/3128* (2013.01); *H01L 23/3135* (2013.01); *H01L 23/367* (2013.01); *H01L 23/3736* (2013.01); *H01L 25/50* (2013.01)

(58) Field of Classification Search
  CPC . H01L 25/074; H01L 25/0756; H01L 25/112; H01L 25/117; H01L 23/36; H01L 23/367; H01L 23/538; H01L 23/5384; H01L 23/3736; H01L 23/3135; H01L 23/3128; H01L 21/4871; H01L 21/56; H01L 21/76898; H01L 21/4882; H01L 2023/4037–4062
  See application file for complete search history.

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,818,640 B1* | 10/2020 | Yu ............... H01L 21/76898 |
| 2015/0111318 A1* | 4/2015 | Lyne ............... H01L 25/50 438/15 |
| 2016/0358899 A1* | 12/2016 | Lee ............... H01L 23/5389 |
| 2020/0083187 A1* | 3/2020 | Wu ............... H01L 21/4857 |

* cited by examiner

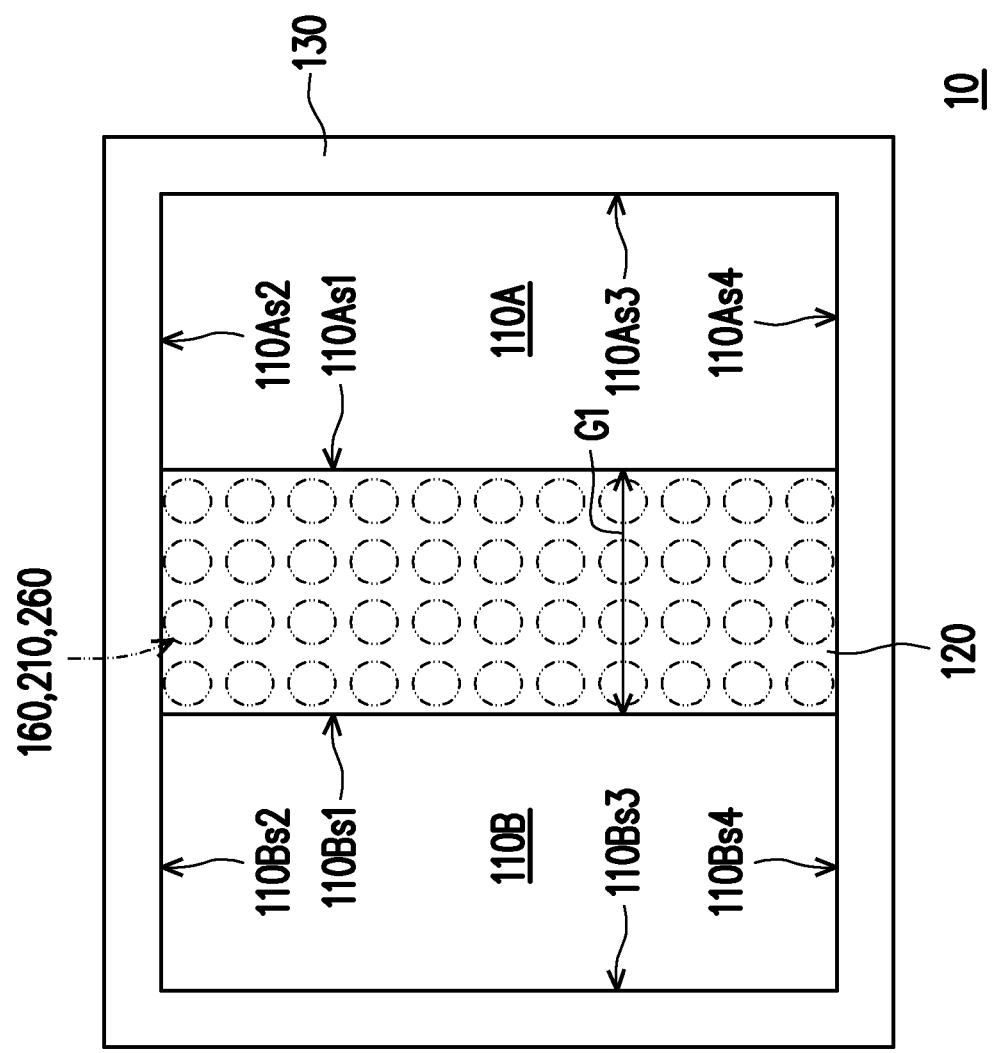

MEMORY MODULE, SEMICONDUCTOR PACKAGE INCLUDING THE SAME, AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for wafer level packaging. Integration of multiple semiconductor devices has become a challenge in the field. To respond to the increasing demand for miniaturization, higher speed, and better electrical performance (e.g., lower transmission loss and insertion loss), more creative packaging and assembling techniques are actively researched.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a schematic top view of a memory module according to some embodiments of the present disclosure.

DETAILED DESCRIPTION

Figure 1A:
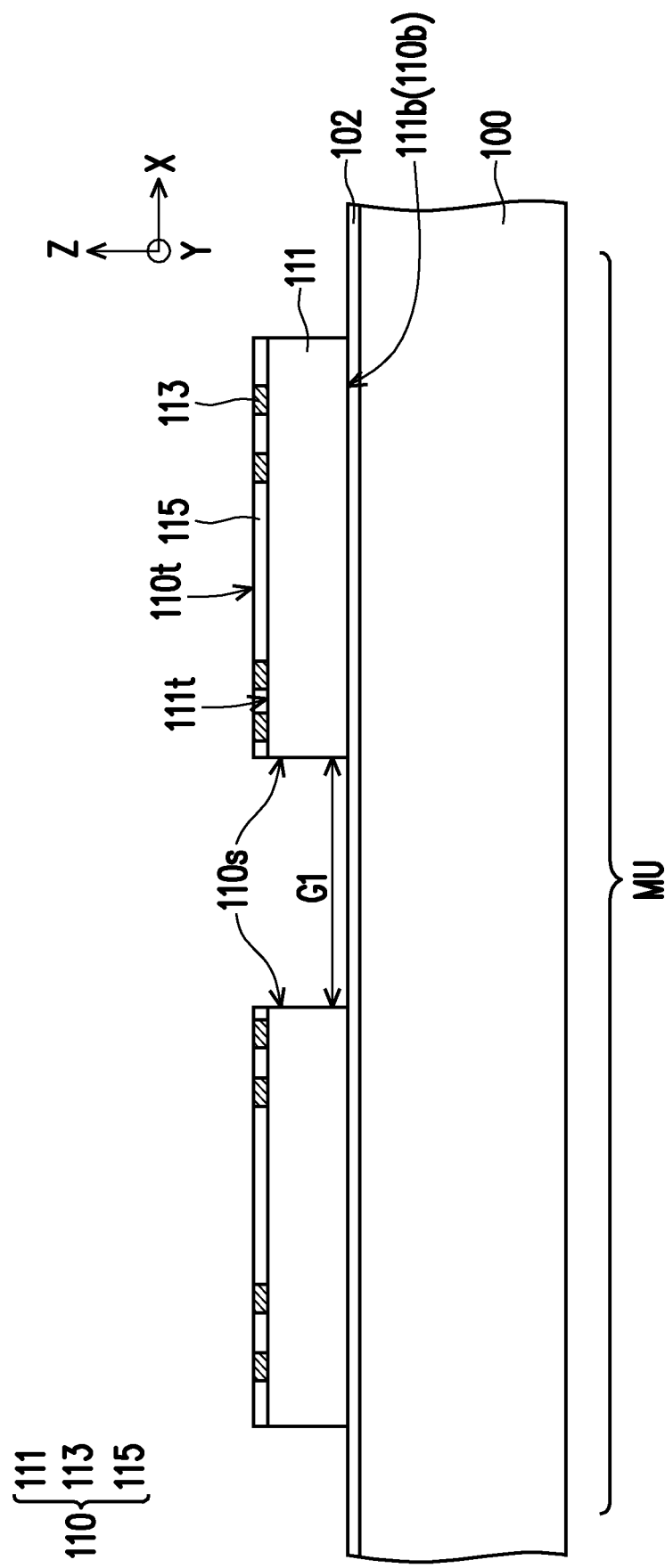
FIG. 1A to FIG. 1L are schematic cross-sectional views of structures produced at various stages of a manufacturing method of a memory module and a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A through FIG. 1L are schematic cross-sectional views of structures produced at various stages of a manufacturing method of a memory module 10 and a semiconductor package 15 according to some embodiments of the present disclosure. Referring to FIG. 1A, a carrier 100 is provided. In some embodiments, the carrier 100 is a glass substrate, a metal plate, a plastic supporting board or the like, but other suitable substrate materials may be used as long as the materials are able to withstand the subsequent steps of the process. In some embodiments, a de-bonding layer 102 is provided on the carrier 100 to facilitate peeling the carrier 100 away from the structure when required by the manufacturing process. In some embodiments, the de-bonding layer 102 includes a light-to-heat conversion (LTHC) release layer.

In some embodiments, semiconductor chips 110 are provided on the carrier 100. In some embodiments, the semiconductor chips 110 are placed onto the carrier 100 through a pick-and-place method. Even though only two semiconductor chips 110 are presented in FIG. 1A for illustrative purposes, a plurality of semiconductor chips 110 may be provided on the carrier 100 to produce multiple module units MU with wafer-level packaging technology. In some embodiments, an individual semiconductor chip 110 includes a semiconductor substrate 111, contact pads 113, and a protective layer 115. The contact pads 113 may be formed at a top surface 111t of the semiconductor substrate 111. The protective layer 115 may cover the top surface 111t of the semiconductor substrate 111 left exposed by the contact pads 113. In some embodiments, the protective layer 115 may further extend on portions of the contact pads 113.

The semiconductor substrate 111 may be made of semiconductor materials, such as semiconductor materials of the groups III-V of the periodic table. In some embodiments, the semiconductor substrate 111 include elemental semiconductor materials, such as crystalline silicon, diamond, or germanium; compound semiconductor materials such as silicon carbide, gallium arsenic, indium arsenide, or indium phosphide or alloy semiconductor materials such as silicon germanium, silicon germanium carbide, gallium arsenic phosphide, or gallium indium phosphide. In certain embodiments, the contact pads 113 include aluminum, copper, or other suitable metals. In some embodiments, the material of the contact pads 113 includes copper, copper alloys, or other conductive materials, and may be formed by deposition, plating, or other suitable techniques. The protective layer 115 may be a single layer or a multi-layered structure, and may include silicon oxide, silicon nitride, silicon oxynitride, other suitable dielectric materials, or combinations thereof. The protective layer 115 may be formed by suitable fabrication techniques such as spin-on coating, chemical vapor deposition (CVD), or the like.

In some embodiments the protective layer 115 may cover the contact pads 113 and (temporarily) constitute a top surface 110t of the semiconductor chips 110. In some embodiments, the semiconductor chips 110 are placed over the carrier 100 with the top surfaces lilt of the semiconductor substrates 111 facing away from the carrier 100. Bottom surfaces 111b of the semiconductor substrates 111 opposite to the top surfaces 110t may form the bottom surfaces 110b of the corresponding semiconductor chips 110. In some embodiments, the semiconductor chips 110 are or include memory dies, and are configured as dynamic random access memories (DRAMs), resistive random access memories (RRAMs), static random access memories (SRAMs), magnetoresistive random access memories (MRAMs), ferroelectric random access memories (FRAMs), or the like.

In some embodiments, the semiconductor chips 110 are disposed over the carrier 100 in pairs. In some embodiments, the semiconductor chips 110 may have an elongated shape (e.g., a rectangular shape). In some embodiments, the semiconductor chips 110 of a pair are disposed on the carrier 100 with wider side surfaces 110s directly facing each other aligned along a first direction Y and separated by a gap G1 along a second direction X perpendicular to the first direction Y. The cross-sectional view of FIG. 1A is taken in a plane defined by the second direction X and a third direction Z, where the three directions XYZ define a set of orthogonal cartesian coordinates, with the first direction Y pointing towards the viewer in FIG. 1A. In some embodiments, the gap G1 may be in the range from 60 μm to 620 μm.

Figure 1B:
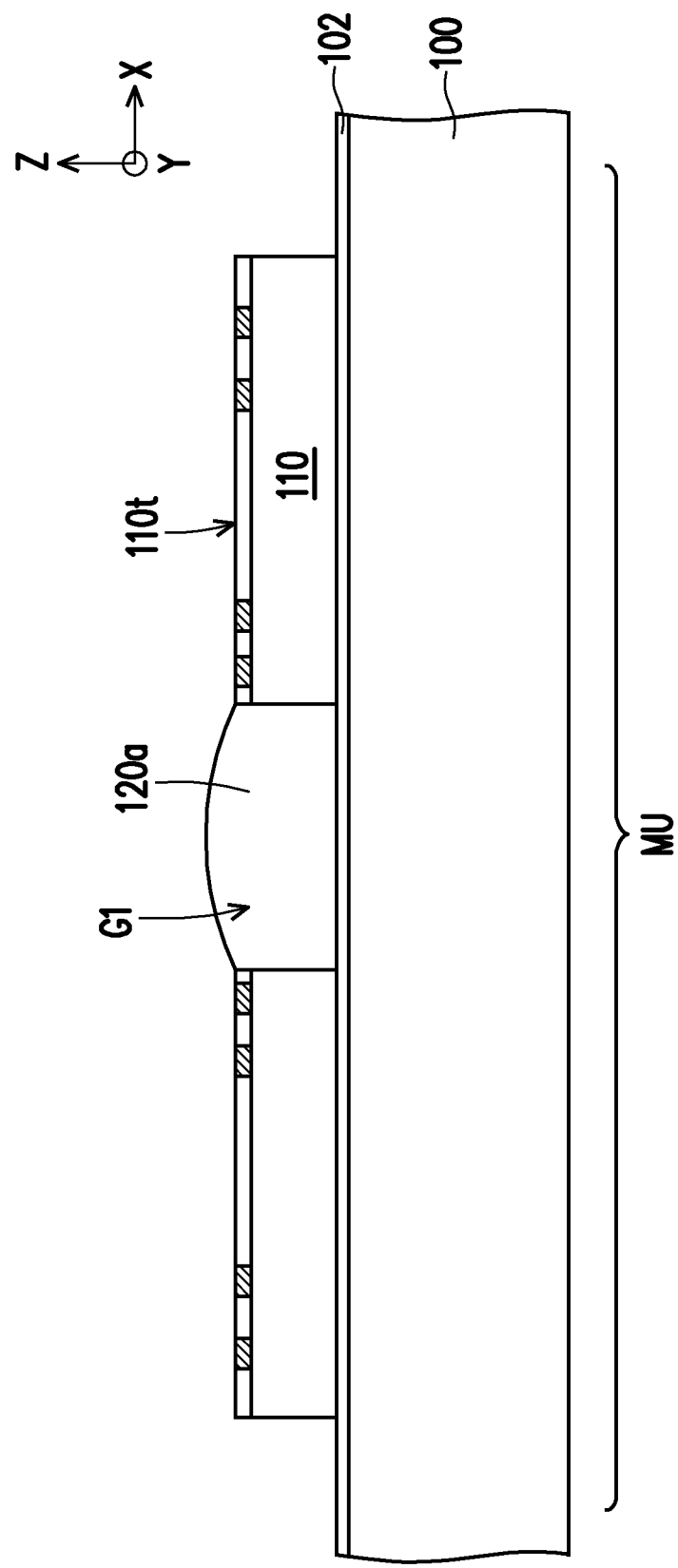

Referring to FIG. 1B, in some embodiments a thermal filler material 120a is applied on the carrier 100 between the semiconductor chips 110 to fill the gap G1. In some embodiments, the thermal filler material 120a includes metals, metal alloys or other thermally conductive materials. In some embodiments, the thermal filler material 120a is a conductive paste including a dispersion of metallic particles. In some alternative embodiments, a solder-based paste is used as thermal filler material 120a. In some embodiments, the thermal filler material 120a includes eutectic solder containing lead or lead-free. In some embodiments, the thermal filler material 120a includes solder containing Sn—Ag, Sn—Cu, Sn—Ag—Cu, or similar soldering alloys. In some embodiments, the thermal filler material 120a includes non-eutectic solder. In some embodiments, the thermal filler material 120a includes ceramics, carbon fiber, graphene, hybrid polymers, or the like. In some embodiments, the thermal filler material 120a has a thermal conductivity equivalent to or larger than 5 watts per kelvin-meter (W/(K·m)). In some embodiments, the thermal filler material 120a is a silver paste. In some embodiments, the silver paste may have a thermal conductivity of about 70 W/(K·m). The choice of the thermally conductive material may be dictated by considerations of desired performances and production costs. In some embodiments, the thermal filler material 120a is dispensed on the carrier 100 via screen printing or other suitable techniques. In some embodiments, the thermal filler material 120a may be cured, for example by heating or irradiation. In some embodiments, the thermal filler material 120a may protrude in the thickness direction Z with respect to the top surfaces 110t of the semiconductor chips 110.

Figure 1C:
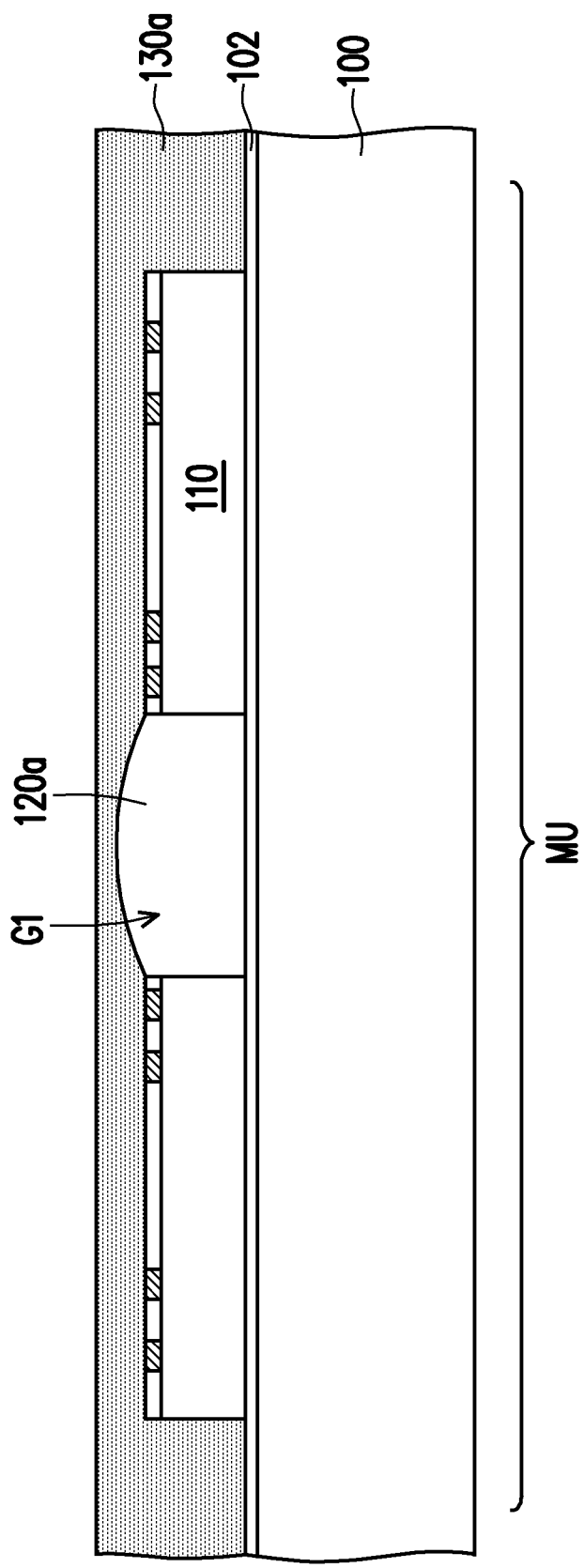
Figure 1D:
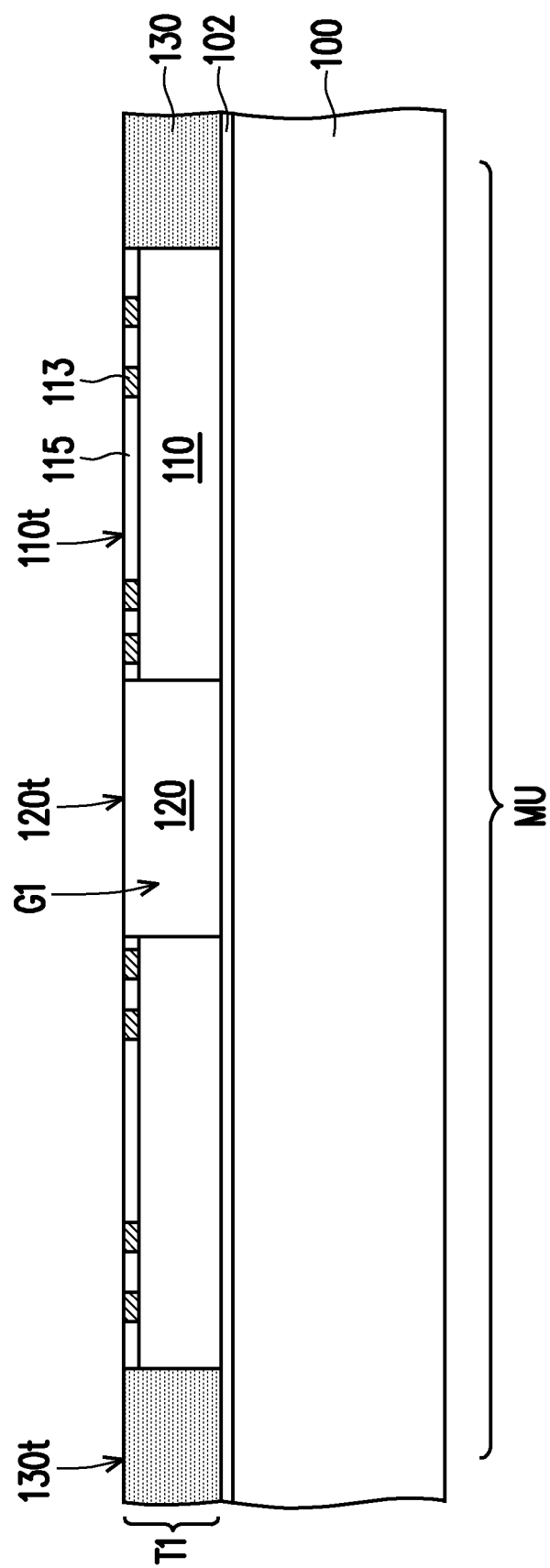

Referring to FIG. 1C, an encapsulating material 130a is formed over the carrier 100. In some embodiments, the encapsulating material 130a covers the semiconductor chips 110 and the thermal filler material 120a. In some embodiments, the encapsulating material 130a includes a molding compound, a molding underfill, a resin (such as an epoxy resin), or the like. In some embodiments, the encapsulating material 130a is formed by an over-molding process. In some embodiments, the encapsulating material 130a is formed by a compression molding process. In some embodiments, the thermal conductivity of the thermal filler material 120a is larger than the thermal conductivity of the encapsulating material 130a. In some embodiments, the thermal conductivity of the thermal filler material 120a is at least larger than the thermal conductivity of the encapsulating material 130a by ~625%. Referring to FIG. 1C and FIG. 1D, in some embodiments, a portion of the encapsulating material 130a is removed to form an encapsulant 130, for example by a planarization process, until the contact pads 113 of the semiconductor chips 110 are exposed. In some embodiments, the planarization of the encapsulating material 130a includes performing a mechanical grinding process and/or a chemical mechanical polishing (CMP) process. Following planarization, top surfaces 110t of the semiconductor chips 110 may be defined by the protective layers 115 and the contact pads 113. That is, following the planarization step, the contact pads 113 may be exposed and available for electrically connecting the semiconductor chips 110 to subsequently formed components or elements. In some embodiments, the top surfaces 110t of the semiconductor chips 110 exposing the contact pads 113 are indicated as active surfaces. In some embodiments, the top surfaces 110t of the semiconductor chips 110 may be substantially coplanar with a top surface 130t of the encapsulant 130. In some embodiments, a portion of the protective layer 115 may be removed during the planarization process to expose the contact pads 113. In some embodiments, portions of the thermal filler material 120a may be removed to form a thermally conductive block 120 disposed between the semiconductor chips 110. In some embodiments, as shown in FIG. 1D, the thermally conductive block 120 fills the gap G1 between the semiconductor chips 110 of a pair. That is, the thermally conductive block 120 extends from one semiconductor chip 110 to the opposite semiconductor chip 110. In some embodiments, a top surface 120t of the thermally conductive block 120 is substantially flush with the top surfaces 110t of the semiconductor chips 110 of the pair. In some embodiments, with formation of the encapsulant 130 is obtained a reconstructed wafer. That is, the top surface 120t of the thermally conductive block 120 is substantially coplanar with (levelled with) the top surface 130t of the encapsulant 130 as well as the top surfaces 110t of the semiconductor chips 110 of the pair. In some embodiments, the reconstructed wafer includes a plurality of modules units MU. In other words, the exemplary process may be performed at a reconstructed wafer level, so that multiple module units MU are processed in the form of a reconstructed wafer. In the cross-sectional view of FIG. 1D, one module unit MU is shown for simplicity, but, of course, this is for illustrative purposes only, and the disclosure is not limited by the number of module units MU being produced in the reconstructed wafer. In some embodiments, the semiconductor chips 110, the thermally conductive block 120 disposed in between, and the encapsulant 130 which laterally surrounds the semiconductor chips 110 and the thermally conductive block 120 are considered a tier T1 of the module unit MU.

Figure 1E:
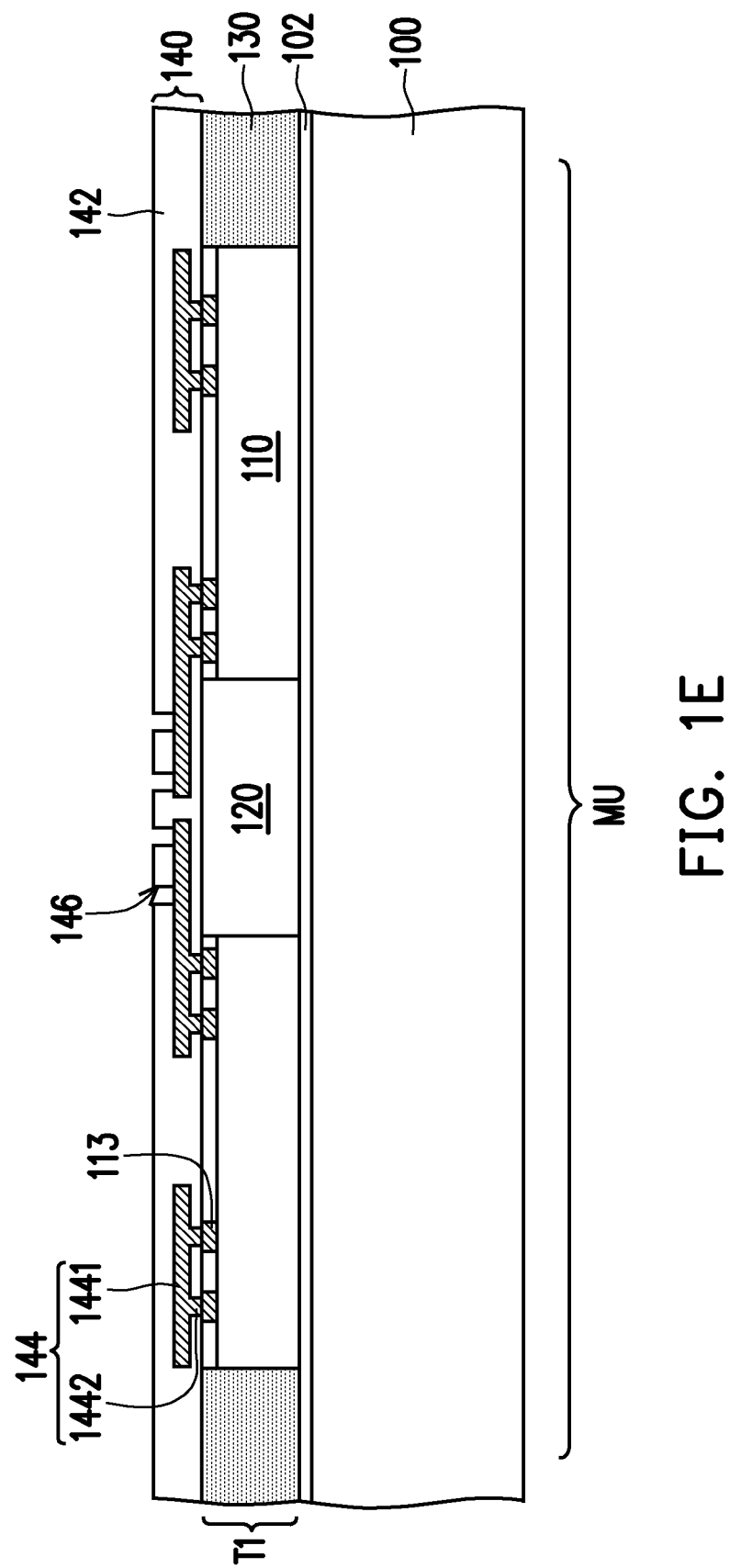

Referring to FIG. 1E, in some embodiments a redistribution structure 140 is formed on the tier T1. In some embodiments, the redistribution structure 140 includes a dielectric layer 142 and a redistribution conductive layer 144. For simplicity, the dielectric layer 142 is illustrated as a single dielectric layer and the redistribution conductive layer 144 is illustrated as embedded in the dielectric layer 142. Nevertheless, from the perspective of the manufacturing process, the dielectric layer 142 is constituted by at least two dielectric layers. The redistribution conductive layer 144 may be constituted by a plurality of redistribution patterns 1441 and via patterns 1442. The redistribution patterns 1441 of the redistribution conductive layer 194 are sandwiched between the two adjacent dielectric layers 142. The via patterns 1442 may extend vertically through the dielectric layer 142 to establish electrical connection between redistribution patterns 1441 of different metallization tiers, or between the redistribution patterns 1441 and the contact pads 113 of the semiconductor chips 110. In some embodiments, the via patterns 1442 may be integrally formed with the redistribution patterns 1441. That is, the via patterns 1442 may be vertically extending portions of the redistribution patterns 1441, formed within the same process step. In some embodiments, redistribution patterns 1441 disposed at a same level height and the one or more via patterns 1442 integrally formed with the redistribution patterns 1441 disposed at a same level height may be referred to as a metallization tier of the redistribution conductive layer 194. In some embodiments, the (outermost) dielectric layer 142 may be patterned to include openings 146 exposing the underlying redistribution conductive layer 144. In some embodiments, the openings 146 of the dielectric layer 142 are formed in the area in between the two semiconductor chips 110 overlying the thermally conductive block 120. That is, vertical projections of the openings 146 may fall on the thermally conductive block 120 rather than on the semiconductor chips 110.

In some embodiments, a material of the redistribution conductive layer 144 includes aluminum, titanium, copper, nickel, tungsten, or alloys thereof. The redistribution conductive layer 144 may be formed by, for example, electroplating, deposition, and/or photolithography and etching. In some embodiments, the material of the dielectric layer 142 includes polyimide, epoxy resin, acrylic resin, phenol resin, benzocyclobutene (BCB), polybenzooxazole (PBO), or any other suitable polymer-based dielectric material. The dielectric layer 142, for example, may be formed by suitable fabrication techniques such as spin-on coating, chemical vapor deposition (CVD), plasma-enhanced chemical vapor deposition (PECVD), or the like. It should be noted that the number of metallization tiers of the redistribution conductive layer 144 and the number of the dielectric layers 142 illustrated in FIG. 1E are merely for illustrative purposes, and the disclosure is not limited thereto. In some alternative embodiments, fewer or more metallization tiers of the redistribution conductive layer 144 and fewer or more layers of the dielectric layer 142 may be formed depending on the circuit design. When more metallization tiers of the redistribution conductive layer 144 and more layers of the dielectric layer 142 are required, the metallization tiers of the redistribution conductive layer 144 are still stacked alternately with the layers of the dielectric layer 142.

Figure 1F:
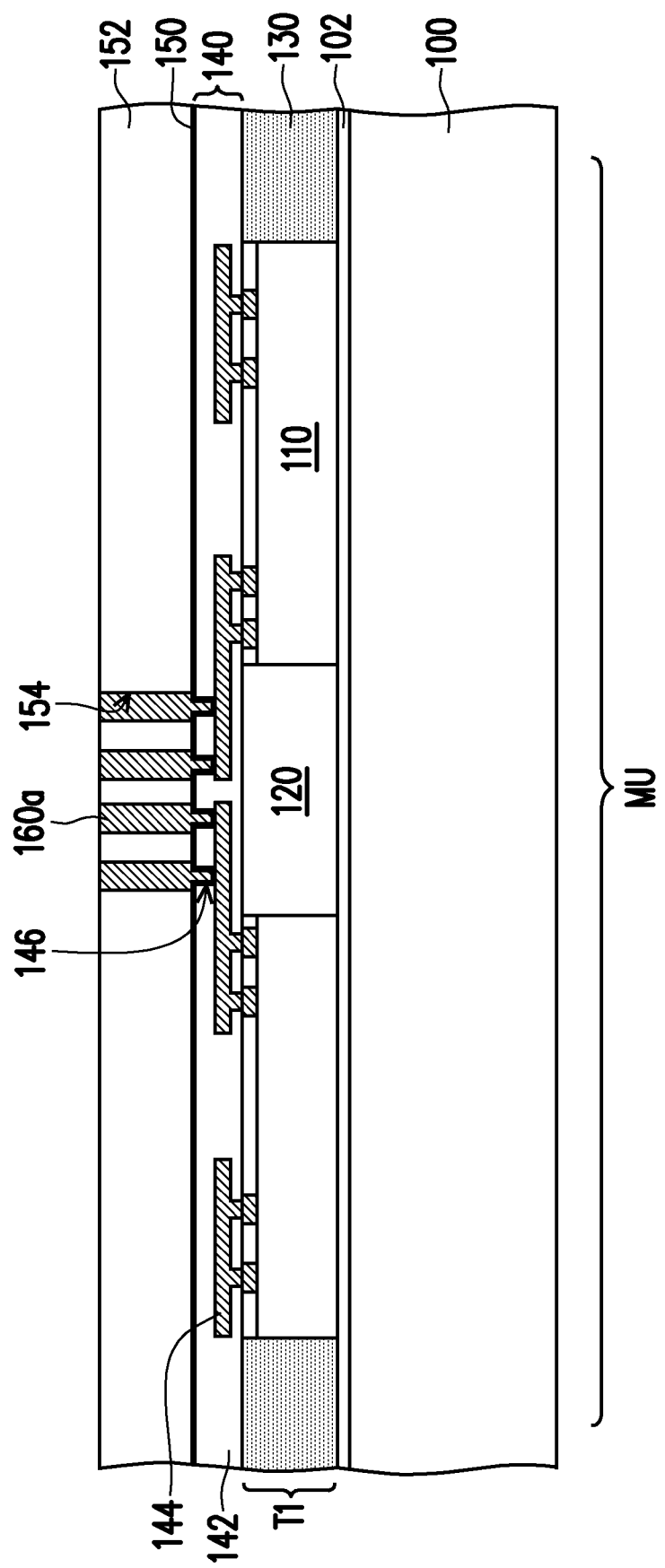
Figure 1G:
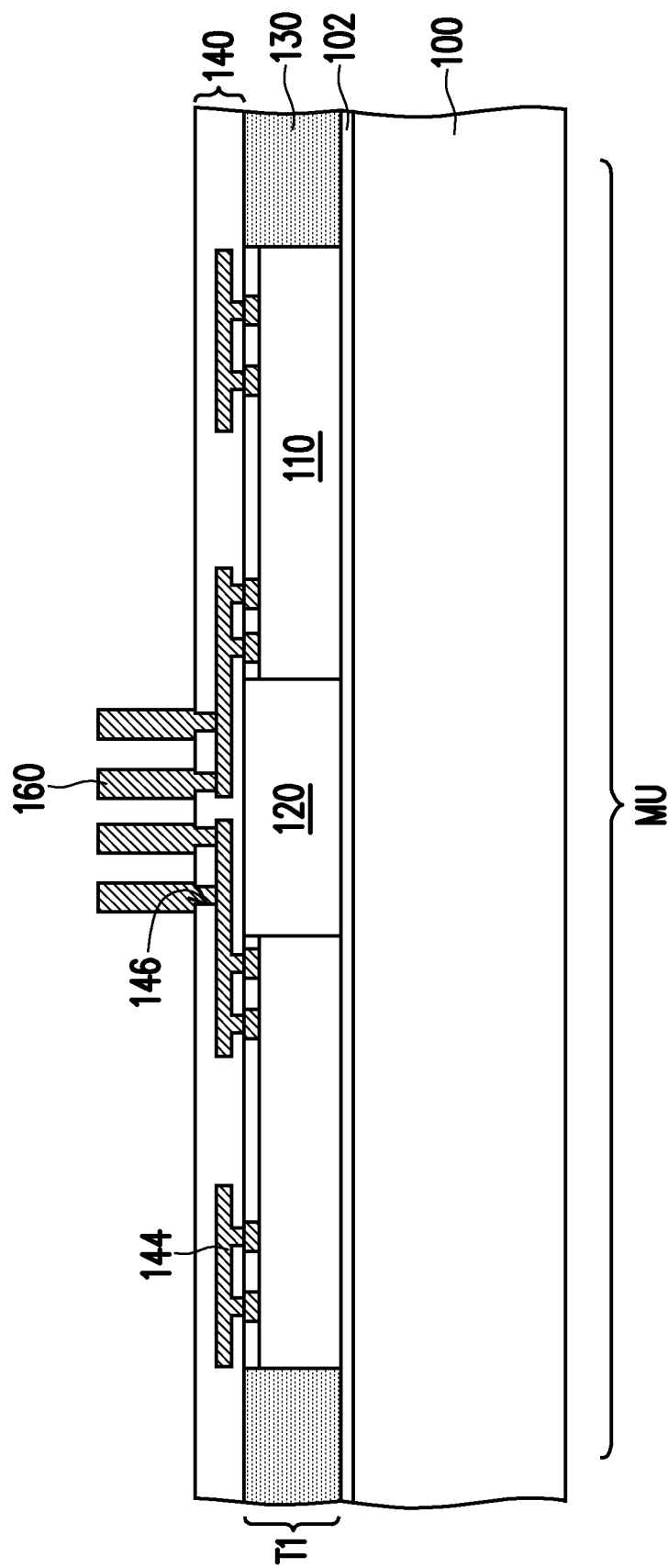

Referring to FIG. 1F and FIG. 1G, in some embodiments, a seed material layer 150 is formed over the redistribution structure 140. In some embodiments, the seed material layer 150 includes a titanium/copper composite layer and is formed by a sputtering process to conformally cover the redistribution structure 140. The seed material layer 150 may extend within the openings 146 of the dielectric layer 142 to contact the exposed portions of the redistribution conductive layer 144. An auxiliary mask 152 patterned with openings 154 is formed on the seed material layer 150. The openings 154 of the auxiliary mask 152 expose the intended locations for the subsequently formed through insulator vias (TIVs) 160. For example, the openings 154 of the auxiliary mask 152 are formed in correspondence of the locations of the openings 146 of the dielectric layer 142. Afterwards, a plating process is performed to form a metal material layer 160a (e.g., a copper layer) on the portions of seed material layer 150 exposed by the openings 154 of the auxiliary mask 152. Subsequently, the auxiliary mask 152 and the seed material layer 150 not covered by the metal material layer 160a are removed, for example via a stripping process and an etching process, to form the TIVs 160. However, the disclosure is not limited thereto. In the drawings of the disclosure, the portion of seed material layer 150 which is retained below the TIVs 160 after stripping of the auxiliary mask 152 is omitted, however, according to some embodiments, portions of seed layer may be disposed below any of the TIVs of the disclosure. In some alternative embodiments, other suitable methods may be utilized to form the TIVs 160. For example, pre-fabricated TIVs 160 (e.g., pre-fabricated copper posts) may be picked-and-placed onto the redistribution structure 140 in correspondence of the openings 146. In some embodiments the TIVs 160 are formed over the thermally conductive block 120. In some embodiments, vertical projections of the TIVs 160 may fall on the semiconductor chips 110 as well as on the thermally conductive block 120. It should be noted that while in FIG. 1G four TIVs are illustrated in a given row, the disclosure is not limited thereto. In some alternative embodiments, more or fewer TIVs 160 may be disposed in a given row according to design and routing requirements. In some embodiments, the number of TIVs 160 in a row may be determined based on the distance (the gap G1) between the semiconductor chips 110 of the tier T1. In some embodiments, the TIVs 160 may not be disposed in a row, depending on the circuit requirements.

Figure 1H:
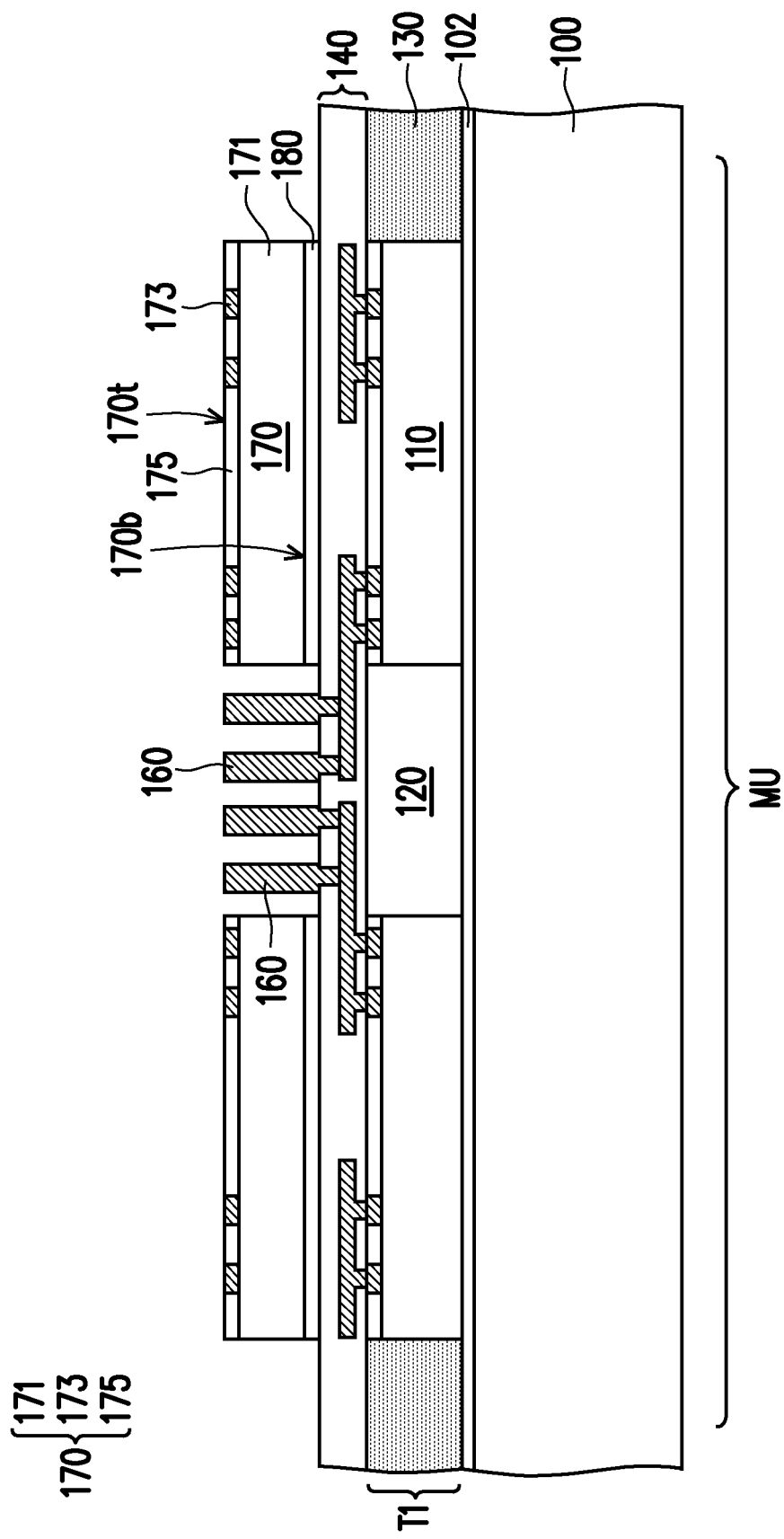

Referring to FIG. 1H, in some embodiments, semiconductor chips 170 are provided on the redistribution structure 140 beside the TIVs 160. In some embodiments, the semiconductor chips 170 are placed onto the redistribution structure 140 through a pick-and-place method. The semiconductor chips 170 may be disposed on the redistribution structure 140 in pairs in correspondence of the semiconductor chips 110 of the tier T1. That is, a first chip of a pair of semiconductor chips 170 may be vertically stacked with one semiconductor chip 110 of a pair in the tier T1, and a second chip of the same pair of semiconductor chips 170 may be vertically stacked with the other semiconductor chip 110 of the pair of the tier T1. That is, the semiconductor chips 170 at least partially overlap with corresponding underlying semiconductor chips 110. The semiconductor chips 170 may be similar to the semiconductor chips 110. Briefly, the semiconductor chips 170 may include a semiconductor substrate 171, contact pads 173, and a protective layer 175. In some embodiments, the semiconductor chips 170 are memory dies. The semiconductor chips 170 may be disposed on the redistribution structure 140 with top surfaces 170t exposing the contact pads 173 facing away from the redistribution structure 140. Portions of die attach film 180 may be disposed on bottom surfaces 170b opposite to the top surfaces 170, and secure the semiconductor chips 170 to the redistribution structure 140. In some embodiments, the die attach film 180 comprises a thermoplastic material, a thermocurable material, or a photocurable material. The die attach film 180 may comprise epoxy resins, phenol resins, polyolefins, or other suitable materials. However, the disclosure is not limited thereto, and other materials or polymers compatible with semiconductor processing environments may be used. The die attach film 180 may be applied via lamination, spin-coating, or other suitable techniques.

Figure 1I:
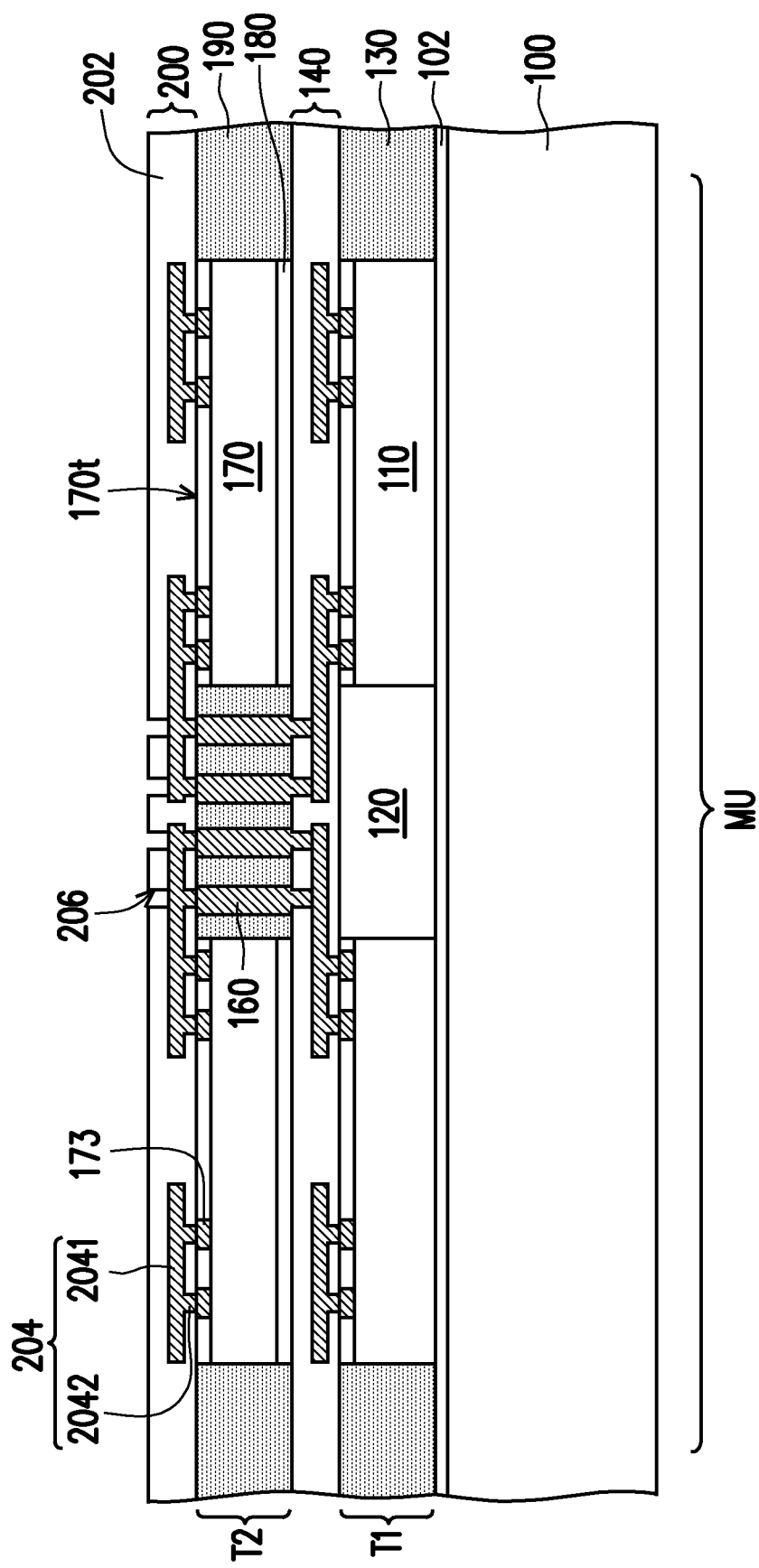

Referring to FIG. 1I, an encapsulant 190 may be produced on the redistribution structure 140 laterally wrapping the semiconductor chips 170 and the TIVs 160. The encapsulant 190 may extend in between adjacent TIVs 160 and in between the semiconductor chips 170 and the TIVs 160. A material and a manufacturing process of the encapsulant 190 may be selected from similar options as listed above for the encapsulant 130. In some embodiments, the TIVs 160, the semiconductor chips 170 and the encapsulant 190 may be considered as a tier T2 of the module unit MU. A redistribution structure 200 may be formed over the encapsulant 190, the semiconductor chips 170 and the TIVs 160. The redistribution structure 200 includes a dielectric layer 202 and a redistribution conductive layer 204. Redistribution patterns 2041 and via patterns 2042 of the redistribution conductive layer 204 are embedded in the dielectric layer 202 and are electrically connected to the semiconductor chips 170 (through the contact pads 173) and to the TIVs 160. The dielectric layer 202 is patterned to form openings 206 exposing portions of the redistribution conductive layer 204 in the region overlying the thermally conductive block 120 and the TIVs 160. The TIVs 160 may establish electrical connection between the redistribution structures 140 and 200 and, consequently, between the semiconductor chips 110 and 170.

Figure 1J:
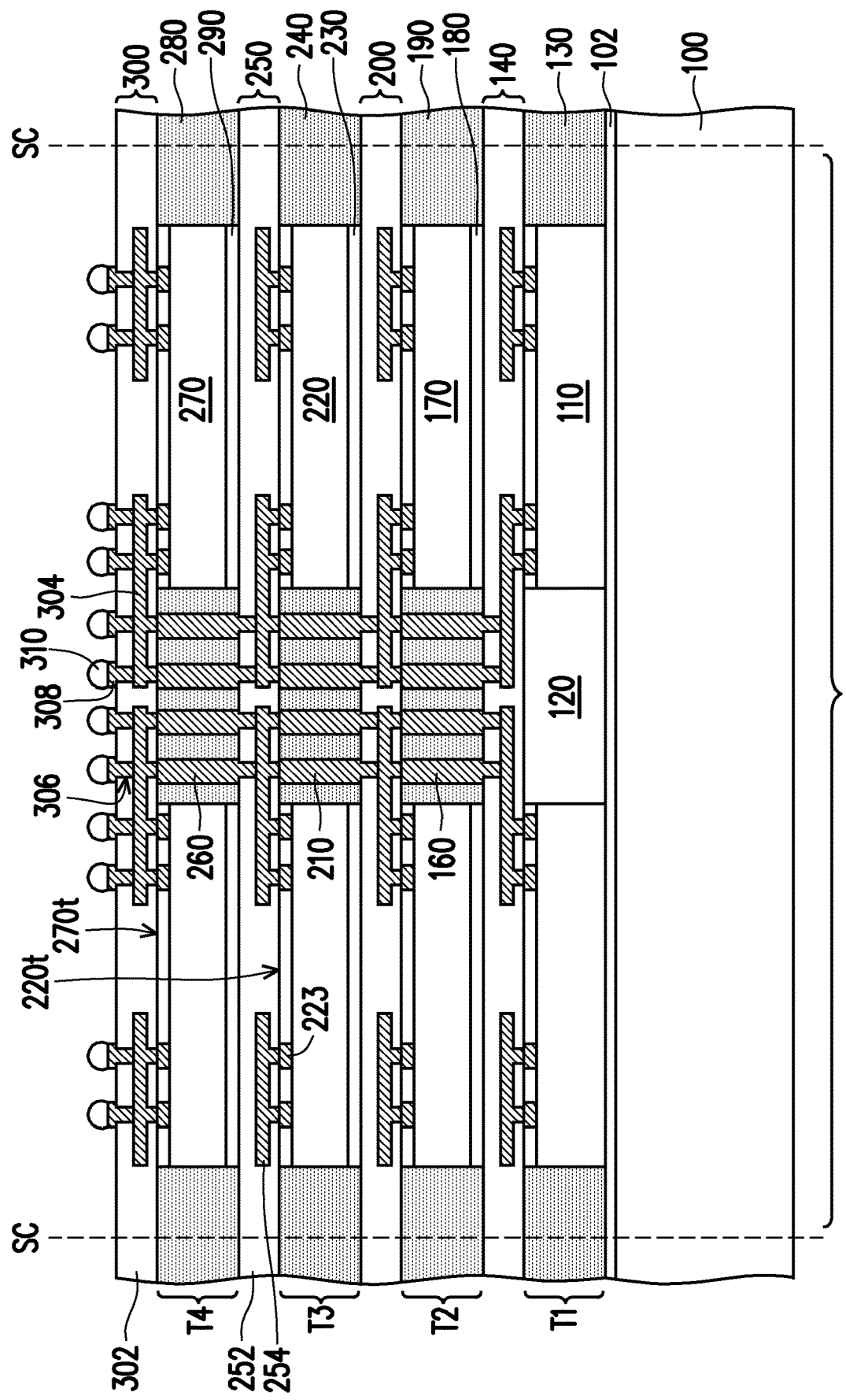

Referring to FIG. 1J, additional tiers (e.g., T3 and T4) may be provided on the tier T2 following similar process steps. That is, TIVs 210 may be formed on the redistributions structure 200 in an area overlying the thermally conductive block 120 and the TIVs 160. The TIVs 210 electrically contacts the redistribution conductive layer 204. Semiconductor chips 220 are disposed beside the TIVs 210, vertically stacked with the semiconductor chips 170 and 110. The semiconductor chips 220 may be disposed with active surfaces 220t where contact pads 223 are exposed further away from the redistribution structure 200. Portions of die attach film 230 may secure the semiconductor chips 220 to the redistribution structure 200. An encapsulant 240 may encapsulate the TIVs 210, the semiconductor chips 220 and the die attach film 230, defining the tier T3. A redistribution structure 250 is formed on the tier T3, including a dielectric layer 252 and a redistribution conductive layer 254 electrically connected to the TIVs 210 and the semiconductor chips 220. The TIVs 210 establish electrical connection between the redistribution structure 250 and the redistribution structure 200. Similarly, TIVs 260 and semiconductor chips 270 may be encapsulated in an encapsulant 280 to define a tier T4. The semiconductor chips 270 are disposed with an active surface 270t facing away from the redistribution structure 250, and portions of die attach film 290 secure the semiconductor chips 270 to the redistribution structure 250. In some embodiments, the TIVs 260 are vertically stacked with the TIVs 210 and 160, and the semiconductor chips 270 are vertically stacked with the semiconductor chips 110, 170 and 220. A redistribution structure 300 is formed on the tier T4, electrically connected to the TIVs 260 and the semiconductor chips 270. The redistribution structure 300 may include a dielectric layer 302 and a redistribution conductive layer 304. The dielectric layer 302 may be patterned to form openings 306 exposing portions of the redistribution conductive layer 304. The openings 306 may be formed over the semiconductor chips 270 as well as over the thermally conductive block 120, throughout the span of the module unit MU. In some embodiments, under-bump metallurgies 308 may optionally be conformally formed in the openings 306 the dielectric layer 302 exposing the redistribution conductive layer 304 and further extend over portions of the exposed surface of the dielectric layer 302. In some embodiments, the under-bump metallurgies 308 include multiple stacked layers. For example, the under-bump metallurgies 308 may include one or more metallic layers stacked on a seed layer. In some embodiments, connective terminals 310 are formed on the under-bump metallurgies 308. The connective terminals 310 may include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e.g., a metal pillar with a solder ball attached), or the like. In some embodiments, the connective terminals 306 are micro bumps. The connective terminals 310 are electrically connected to the semiconductor chips 110, 170, 220, 270 through the TIVs 160, 210, 260, and the redistribution structures 140, 200, 250, 300. In some embodiments, after formation of the connective terminals 310, the reconstructed wafer may be diced to separate the individual module units MU, for example by cutting along scribe lines SC. In some embodiments, the carrier 100 and the de-bonding layer 102 may be removed to produce the memory modules 10 shown in FIG. 1K. In some embodiments, after removing the de-bonding layer 102, the exposed surface of the thermally conductive block 120 is substantially coplanar with (levelled with) the exposed surface of the encapsulant 130 as well as the backside surfaces of the semiconductor chips 110 of the pair.

Figure 1K:
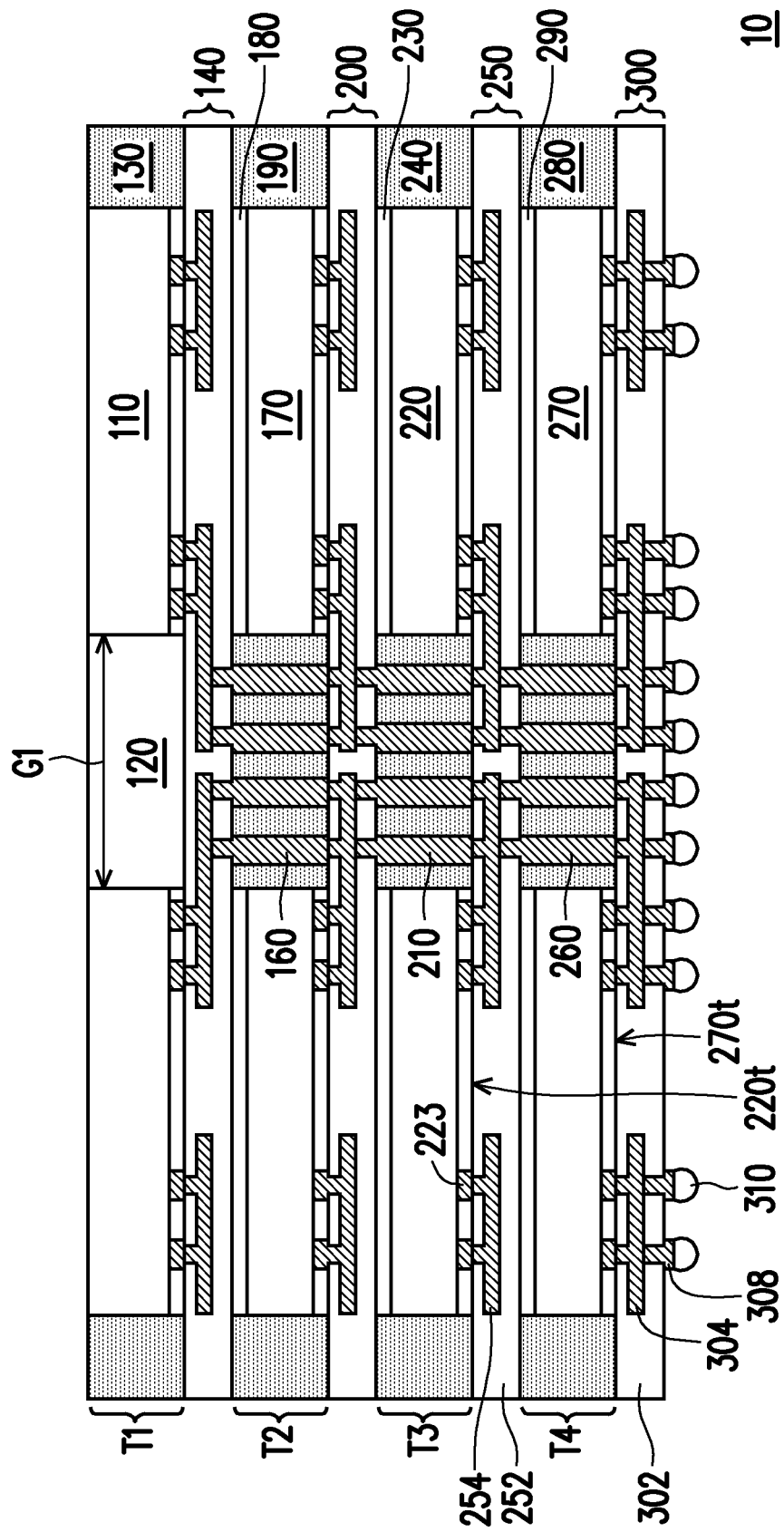

Referring to FIG. 1K, in some embodiments a memory module 10 includes multiple tiers T1-T4 of stacked semiconductor chips 110, 170, 220, 270 encapsulated by respective encapsulants 130, 190, 240, 280. In some embodiments, the semiconductor chips 110, 170, 220, 270 may be disposed in matching locations of the corresponding tiers T1-T4. For example, a semiconductor chip 110 of the tier T1, a semiconductor chip 170 of the tier T2 a semiconductor chip 220 of the tier T3 and a semiconductor chip 270 of the tier T4 may be vertically aligned, forming a column of stacked semiconductor chips. Other semiconductor chips 110, 170, 220, 270 of the same tiers T1-T4 may form one or more other columns of stacked semiconductor chips, and the TIVs 160, 210, 260 and the thermally conductive block 120 may be disposed in between the columns of stacked semiconductor chips. Semiconductor chips 110, 170, 220, 270 may be interconnected via redistribution structures 140, 200, 250, 300 interposed between pairs of adjacent tiers T1-T4 and TIVs 160, 210, 260 providing vertical interconnection by extending through the corresponding encapsulants 190, 240, 280. In some embodiments, the tier T1 may be referred to as a topmost tier, and the tiers T2-T4 may be referred to as lower tiers. In some embodiments, the redistribution structure 140 is referred to as a topmost redistribution structure. In some embodiments, vertically stacked semiconductor chips 110, 170, 220, 270 are interconnected by TIVs 160, 210, 260 and redistribution structures 140, 200, 250, 300 rather than conductive vias running through the semiconductor substrates of the respective semiconductor chips 110, 170, 220, 270. In some embodiments, by avoiding formation of through substrate vias in the semiconductor chips 110, 170, 220, 270, the manufacturing costs of a memory module 10 may be reduced. In some embodiments, the semiconductor chips 170, 220, 270 of the later formed tiers T2-T4 are secured to the previously formed redistribution structures 140, 200, 250 via portions of die attach film 180, 230, 290. The TIVs 160, 210, 260 of different tiers T2-T4 may be vertically stacked with respect to each other, and disposed in between semiconductor chips 170, 220, 270 of the corresponding tiers T2-T4. In some embodiments, the tiers T2-T4 are alternately stacked with redistribution structures 200, 250, 300. In some embodiments, when the memory module 10 is connected to other devices (not shown) via the connective terminals 310, heat produced during usage may converge towards the region overlying the TIVs 160, 210, 260 in between the semiconductor chips 110 of the tier T1. In some embodiments, by filling the gap G1 with the thermally conductive block 120, the thermal resistance of the memory module 10 may be reduced and heat dissipation may be enhanced. As such, the reliability and the lifetime of the memory module 10 may be increased.

Figure 1L:
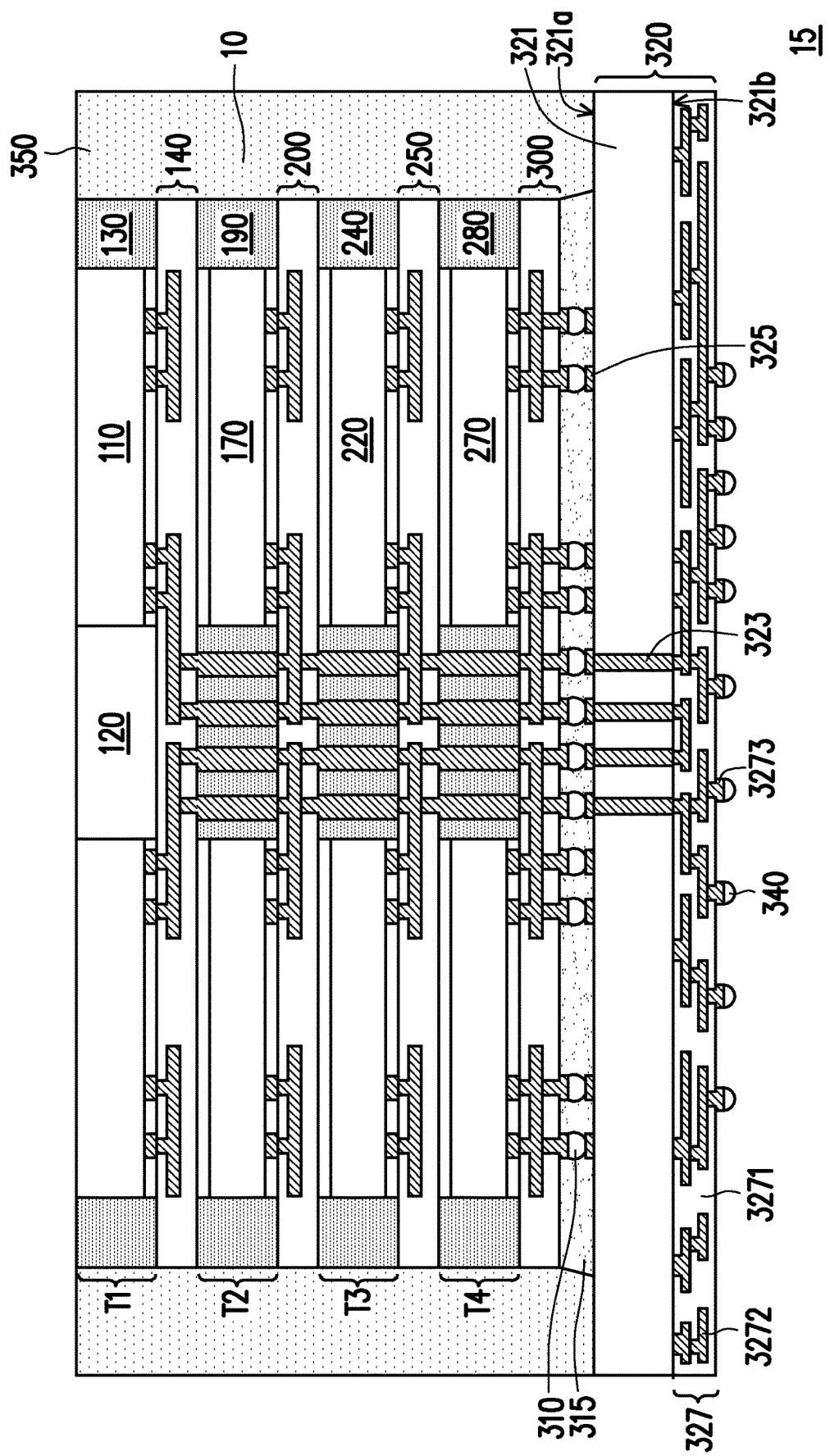

In FIG. 1L is shown a semiconductor package 15 according to some embodiments of the disclosure. In the semiconductor package 15, the memory module 10 is connected to a logic die 320 via the connective terminals 310. The logic die 320 includes a semiconductor substrate 321, through substrate vias (TSVs) 323, contact pads 325 disposed on a surface 321a of the semiconductor substrate 321 facing the memory module 10 and an interconnection structure 327 formed on a surface 321b of the semiconductor substrate 321 opposite to the surface 321a. The logic die 320 may have a larger footprint than the memory module 10. That is, a vertical projection of the memory module 10 may fall entirely on the logic die 320. In some embodiments, the TSVs 323 may be formed in an area of the logic die 320 which corresponds to the area of the memory module 10 in which the TIVs 160, 210, 260 are formed, however the disclosure is not limited thereto. The contact pads 325 may be formed on the ends of the TSVs 323 closer to the memory module 10, as well as on regions of the semiconductor substrate 321 in which active or passive components are formed. The connective terminals 310 may be in physical and electrical contact with the contact pads 325. An underfill 315 may physically protect the connection between the connective terminals 310 and the contact pads 325. In some embodiments, the interconnection structure 327 includes a dielectric layer 3271, interconnection conductive patterns 3272 and under-ball metallurgies 3273. The interconnection conductive patterns 3272 may be embedded in the dielectric layer 3271 and establish electrical contact with components formed in the semiconductor substrate 321 and with the TSVs 323. The under-ball metallurgies 3273 may be disposed on a surface of the dielectric layer 3271 further away from the semiconductor substrate 321, and be electrically connected to the interconnection conductive patterns 3272. Conductive terminals 340 (e.g., C4 balls) may be formed on the under-ball metallurgies 3273. In some embodiments, an encapsulant 350 is formed on the logic die 320 to encapsulate the memory module 10 and the underfill 315. In some embodiments, the encapsulant 350 may cover the side surfaces of the memory module 10 while leaving exposed the semiconductor chips 110, the thermally conductive block 120 and the encapsulant 130 at a top surface of the memory module 10.

Figure 1M:
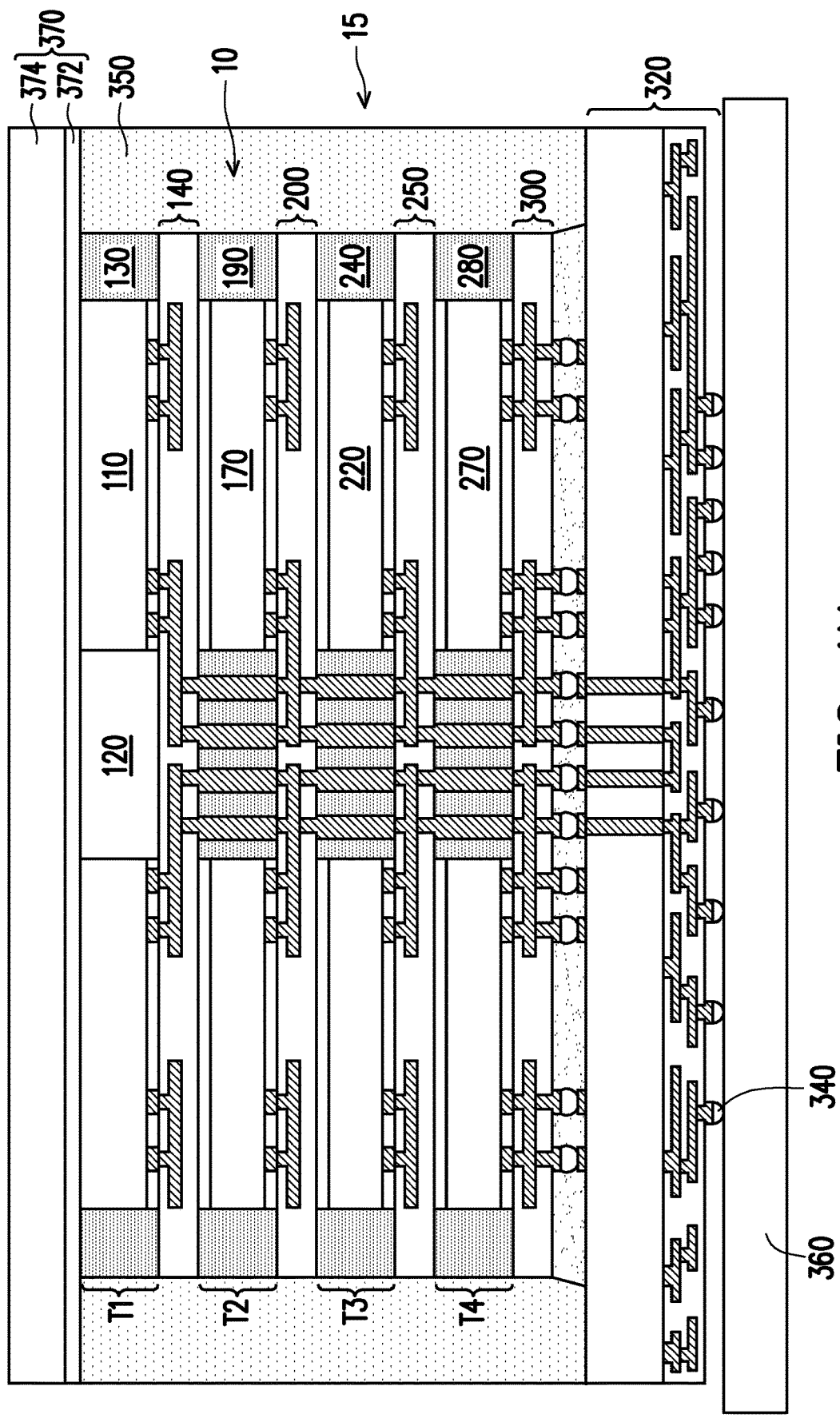
FIG. 1M is a schematic cross-sectional view of a semiconductor package connected to a circuit substrate according to some embodiments of the present disclosure.

According to some embodiments, the semiconductor package 15 may be connected to a circuit substrate 360 such as a motherboard, a printed circuit board, or the like, as shown in FIG. 1M. In some embodiments, a heat dissipation system 370 may be disposed on top of the semiconductor package 15, covering the encapsulant 350 and the exposed top surface of the memory module 10. In some embodiments, the heat dissipation system 370 includes a thermal interface material 372 and a heat sink 374. In some embodiments, the thermal interface material 372 extends on the semiconductor chips 110 and the thermally conductive block 120. The thermal interface material 372 may include a polysiloxane resin having particles of alumina, zinc oxide, silver, or a combination thereof suspended therein. In some embodiments, other materials may be used for the thermal interface material 372, provided they are thermally conductive and display acceptable to good adhesive properties with the contacting materials of memory module 10 and the heat sink 374. The thermal interface material 372 may be formed by stencil printing, spin coating, dispensing or other suitable techniques. The heat sink 374 may be disposed on the thermal interface material 372. In some embodiment, the heat sink 374 is manufactured separately and disposed over the thermal interface material 372. A material of the heat sink 374 may include metals such as copper, nickel, their alloys, or combination thereof.

FIG. 2 is a schematic top view of a memory module 10 according to some embodiments of the disclosure. Referring to FIG. 1K and FIG. 2, in some embodiments, the tier T1 includes two semiconductor chips, 110A and 110B. In some embodiments, the semiconductor chips 110A, 110B, the thermally conductive block 120, and the encapsulant 130 are exposed at the top surface of the memory module 10. In some embodiments, the thermally conductive block 120 fills the gap G1 in between opposite facing surfaces 110As1, 110Bs1 of the semiconductor chips 110A, 110B. The encapsulant 130 may surround the semiconductor chips 110A, 110B and the thermally conductive block 120. In some embodiments, one side surface of a semiconductor chip 110 (e.g., 110As1 and 110Bs1 for the semiconductor chips 110A and 110B, respectively) directly faces the thermally conductive block 120, and the remaining side surfaces 110As2-110As4, 110Bs2-110Bs4 directly face the encapsulant 130. The encapsulant 130 may have an annular shape, and extend around the semiconductor chips 110A, 110B and the thermally conductive block 120. In FIG. 2 the positions of the TIVs 160, 210, 260 is shown with dash-dotted lines for clarity's sake, even though the TIVs 160, 210, 260 would not be visible from the top view. In some embodiments, vertical projections of the TIVs 160, 210, 260 fall within the span of the thermally conductive block 120, however the disclosure is not limited thereto. In some embodiments, the vertical projections of the TIVs 160, 210, 260 may also fall on the semiconductor chips 110A, 110B.

Figure 3A:
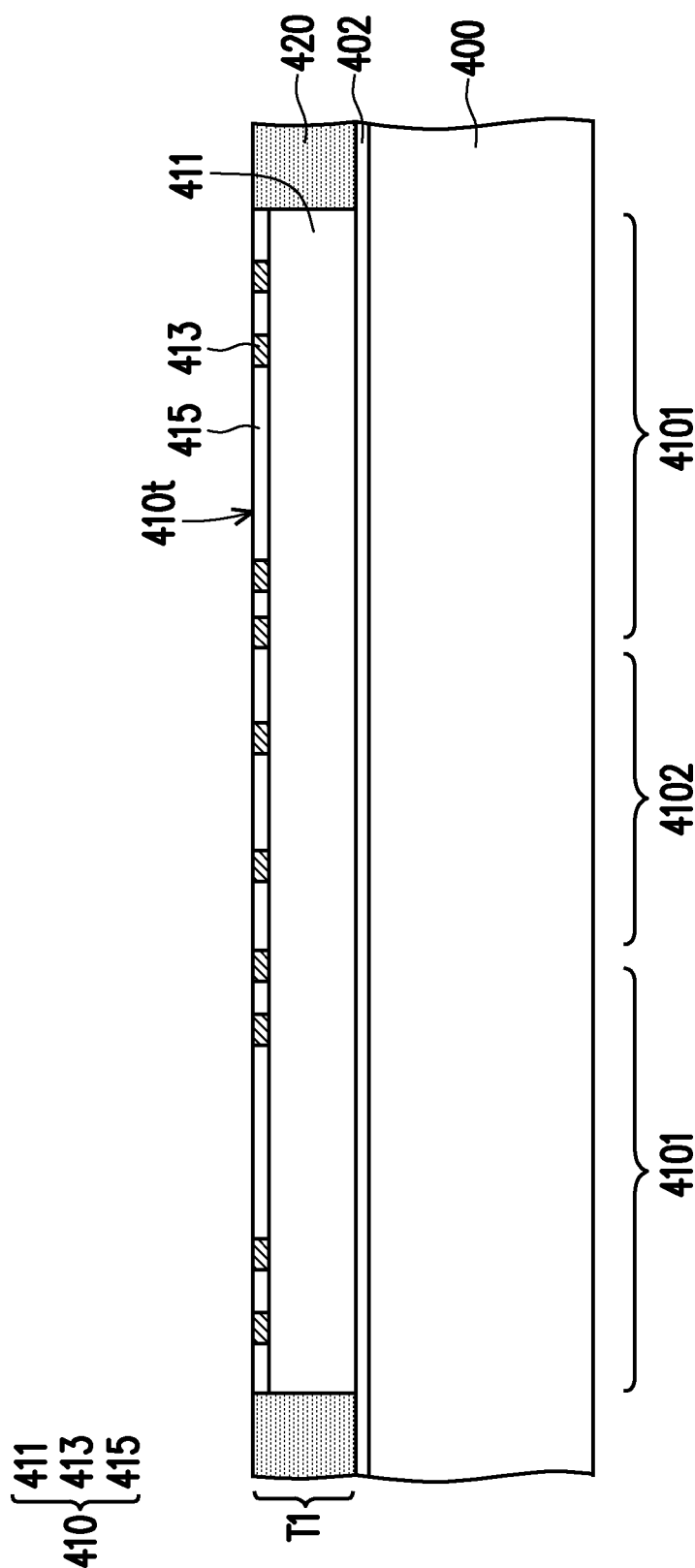
FIG. 3A to FIG. 3C are schematic cross-sectional views of structures produced at various stages of a manufacturing method of a memory module and a semiconductor package according to some embodiments of the present disclosure.
Figure 3B:
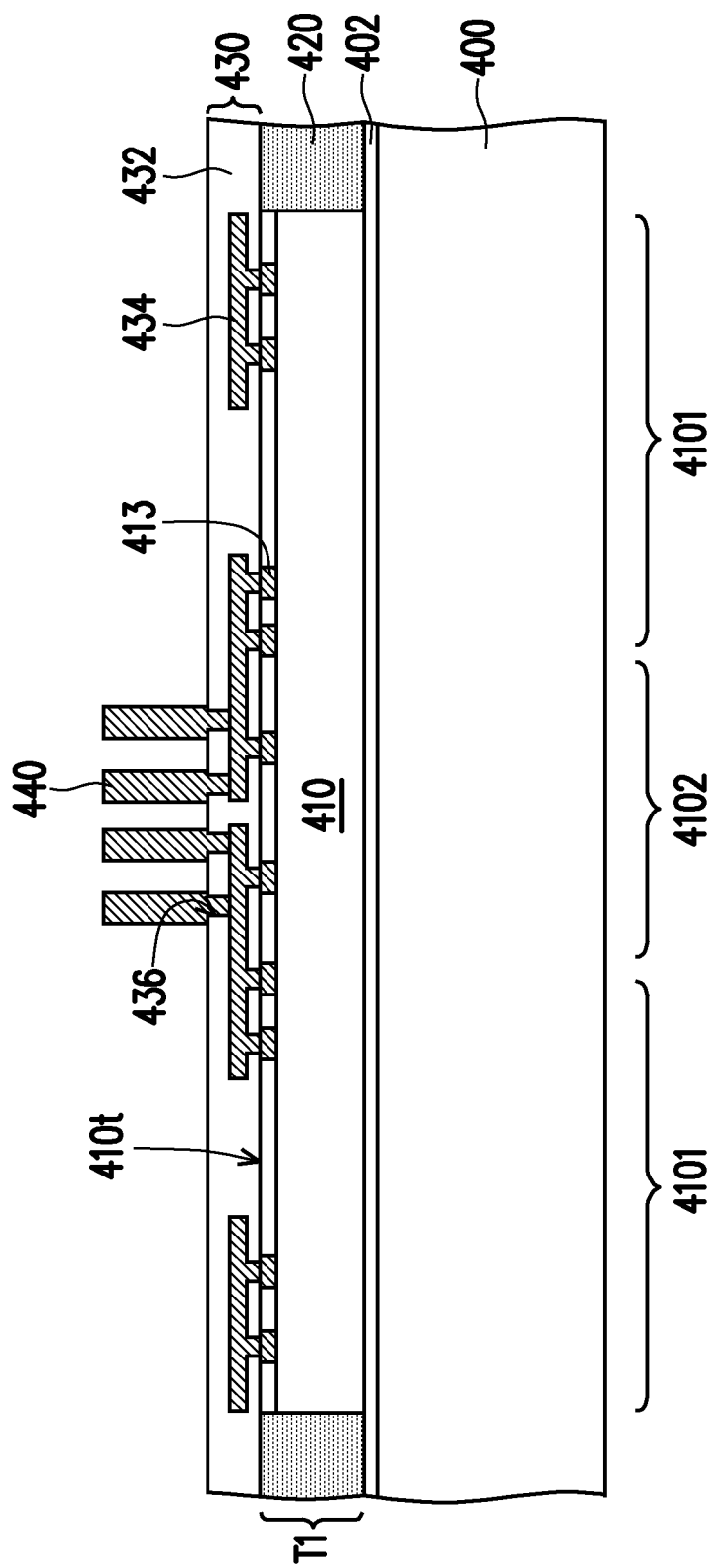
Figure 3C:
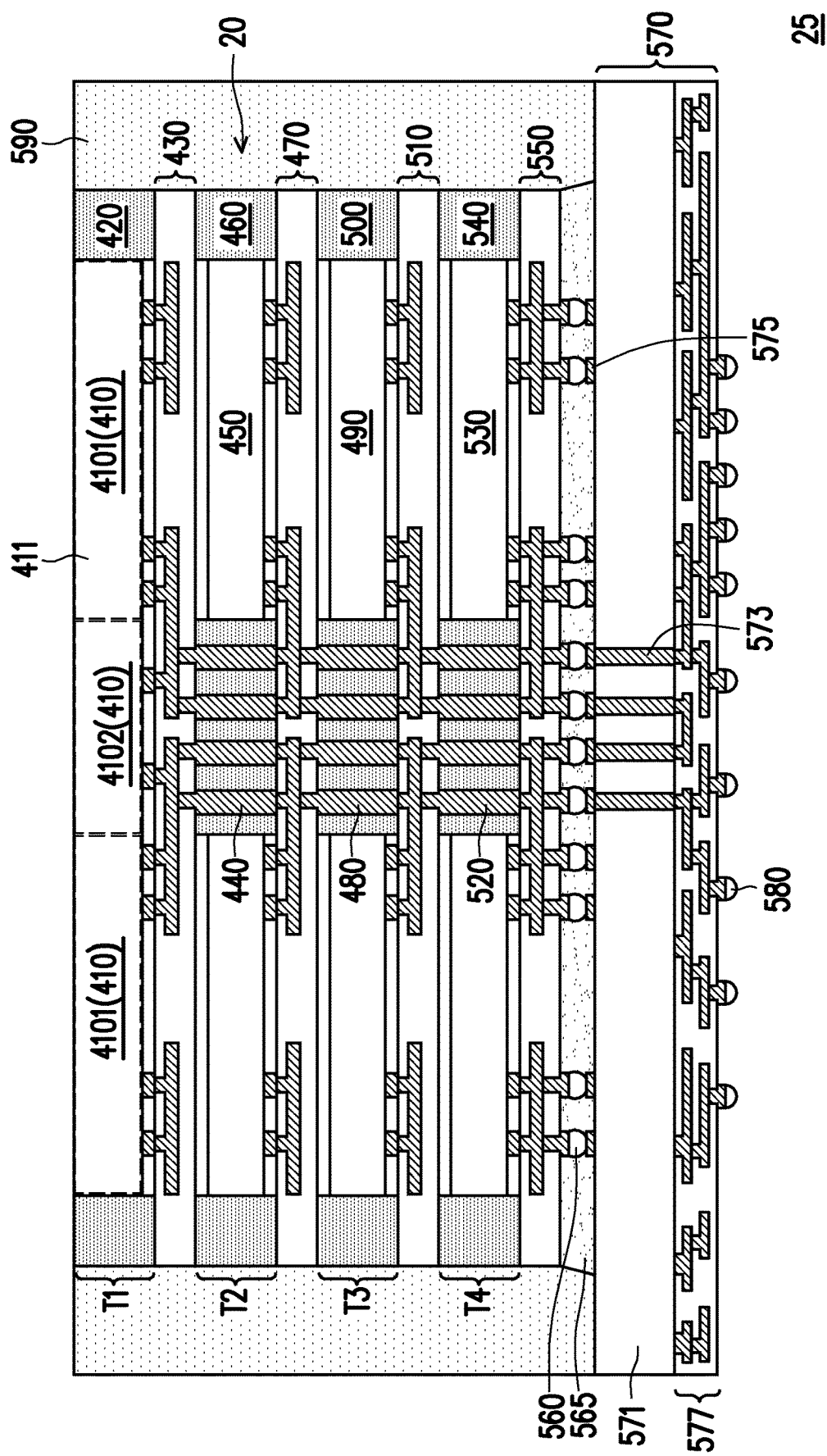

FIG. 3A to FIG. 3C are schematic cross-sectional views of structures produced during a manufacturing method of a memory module 20 and a semiconductor package 25 according to some embodiments of the disclosure. In some embodiments, a carrier 400 with, optionally, a de-bonding layer 402 thereon is provided. Thereafter, an unsplit die 410 is disposed on the carrier 400. The unsplit die 410 may include a semiconductor substrate 411, contact pads 413 disposed on the semiconductor substrate 411 and a passivation layer 415 covering the portion of top surface of the semiconductor substrate 411 left exposed by the contact pads 413. In some embodiments, the semiconductor substrate 411 is formed of a semiconductor material. For example, the semiconductor substrate 411 of the unsplit die 410 may be made of silicon, which has a thermal conductivity of about 140 W/(K·m). In some embodiments, the unsplit die 410 is disposed on the carrier 400 with the contact pads 413 facing away from the carrier. In some embodiments, the unsplit die 410 include multiple semiconductor chips 4101 formed therein in different regions of the semiconductor substrate 411. That is, each semiconductor chip 4101 includes a portion of the semiconductor substrate 411. In some embodiments, the semiconductor chips 4101 are joined by a joining portion 4102 of semiconductor substrate 411. In some embodiments, the semiconductor chips 4101 are formed at the sides of the joining portion 4102, and are separated by the joining portion 4102. In some embodiments, the joining portion 4102, being a part of the same semiconductor substrate 411 in which the semiconductor chips 4101 are formed, is integrally formed with the semiconductor chips 4101. In some embodiments, the semiconductor chips 4101 formed in the unsplit die 410 are memory chips. In some embodiments, the contact pads 413 are formed in correspondence of the semiconductor chips 4101. In some embodiments, the contact pads 413 are also formed in correspondence of the joining portion 4102.

Referring to FIG. 3A, in some embodiments, an encapsulant 420 is formed over the carrier 400 laterally wrapping the unsplit die 410. A material and a manufacturing process of the encapsulant 420 may be selected from similar options as listed above for the encapsulant 130 (shown in FIG. 1D). In some embodiments, a tier T1 of the memory module being produced includes the unsplit die 410 and the encapsulant 420.

Referring to FIG. 3B, in some embodiments, a redistribution structure 430 is formed over the tier T1. The redistribution structure 430 extends on the unsplit die 410 and the encapsulant 420. The redistribution structure 430 includes a dielectric layer 432 and redistribution conductive layer 434 embedded in the dielectric layer 432. The redistribution conductive layer 432 establishes electrical connection with the semiconductor chips 4101 in the unsplit die 410 through the contact pads 413. In some embodiments, the dielectric layer 432 is patterned to form openings 436 exposing portions of the redistribution conductive layer 434. In some embodiments, the openings 436 are formed in an area of the redistribution structure 430 overlying the joining portion 4102 of the unsplit die 410. TIVs 440 are formed in the openings 436, similarly to what was described before for the TIVs 160 (shown in FIG. 1F).

In some embodiments, process steps similar to the ones discussed above with reference to FIG. 1H to FIG. 1L may be performed to produce a memory module 20 and integrate the memory module 20 in a semiconductor package 25 (shown in FIG. 3C). In some embodiments, the memory module 20 includes multiple tiers T1-T4 of semiconductor chips 4101, 450, 490, 530 embedded in corresponding encapsulants 130, 190, 240, 280. In some embodiments, the semiconductor chips 4101 of the tier T1 are part of an unsplit die 410. The several tiers T1-T4 of the memory module 20 may be interconnected by redistribution structures 430, 470, 510 interposed between pairs of adjacent tiers T1-T4, and a further redistribution structure 550 may be disposed over the last tier T4. In some embodiments, the tier T1 is referred to as a topmost tier, and the tiers T2-T4 are referred to as lower tiers. In some embodiments, the redistribution structure 430 is referred to as a topmost redistribution structure. In the tiers T2-T4, the semiconductor chips 450, 490, 530 may be disposed vertically overlapping with the areas of the unsplit die 410 in which the semiconductor chip 4101 are formed. TIVs 440, 480, 520 are formed in the tiers T2-T4 in between the semiconductor chips 450, 490, 530. In some embodiments, the TIVs 440, 480, 520 are formed vertically overlapping with the joining portion 4102 of the unsplit die 410. In some embodiments, heat produced during usage of the memory module 20 may converge towards the region overlying the TIVs 440, 480, 520 in between the semiconductor chips 4101 of the tier T1. In some embodiments, as the joining portion 4102 is made of a semiconductor material which is also a thermally conductive material, the thermal resistance of the memory module 20 may be reduced and heat dissipation may be enhanced. As such, the reliability and the lifetime of the memory module 20 may be increased.

In some embodiments, connective terminals 560 are formed on the redistribution structure 550 and may be used to connect the memory module 20 to a logic die 570 in the semiconductor package 25. In some embodiments, the logic die 570 may be similar to the logic die 320 of FIG. 1L. For example, the logic die 570 may include a semiconductor substrate 571, through substrate vias 573, contact pads 575 and an interconnection structure 577. The connective terminals 560 may establish electrical connection to the logic die 570 through the contact pads 575. An underfill 565 may be disposed between the memory module 20 and the logic die 570 to protect the connection between the memory module 20 and the logic die 570. In some embodiments, conductive terminals 580 are formed on the interconnection structure 577 further away from the semiconductor substrate 571. In some embodiments, the conductive terminals 580 may be used to integrate the semiconductor package 25 into larger devices. In some embodiments, an encapsulant 590 is formed on the logic die 570 to embed the memory module 20 and the underfill 565.

Figure 4:
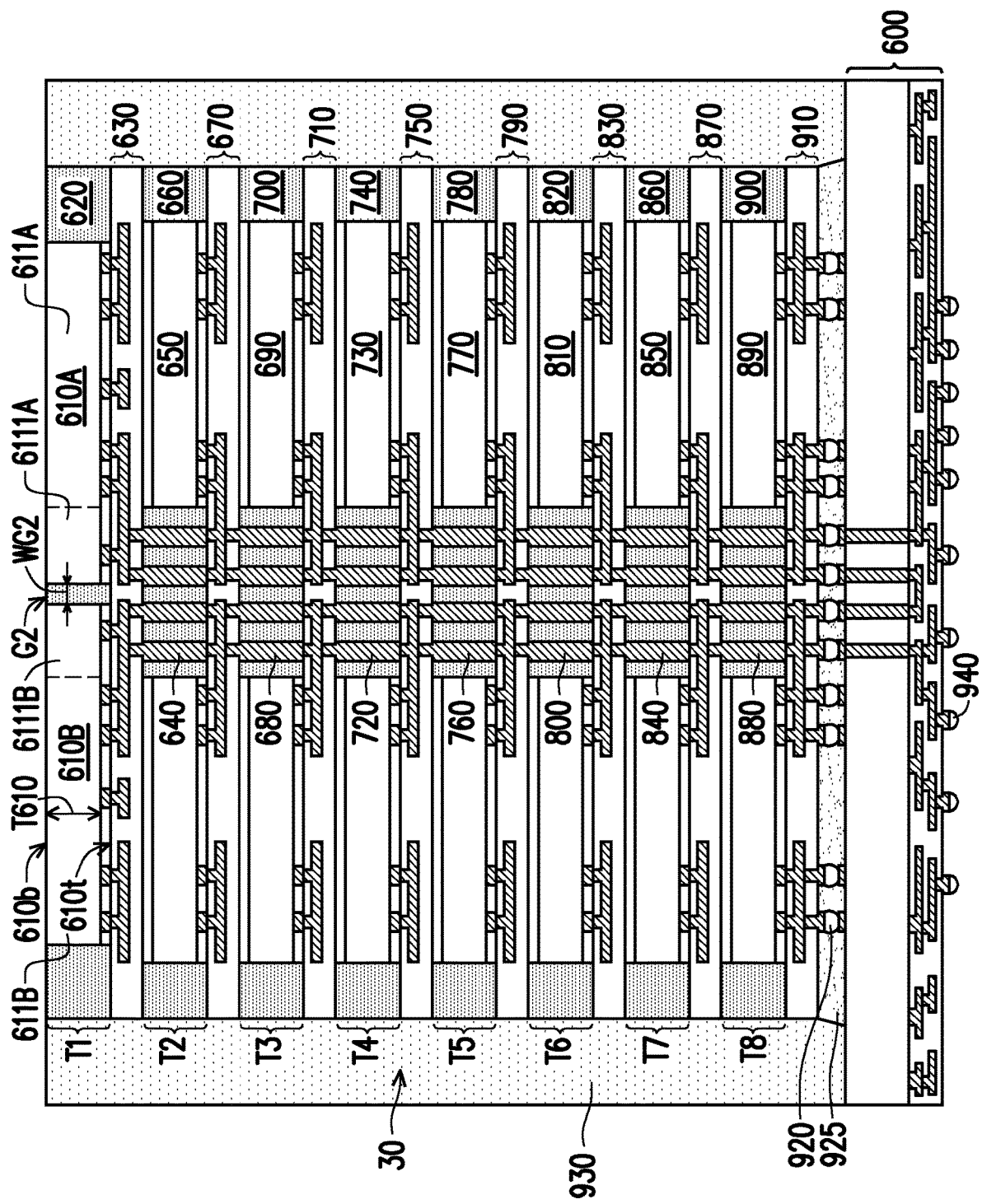
FIG. 4 is a schematic cross-sectional view of a semiconductor package according to some embodiments of the present disclosure.
Figure 5:
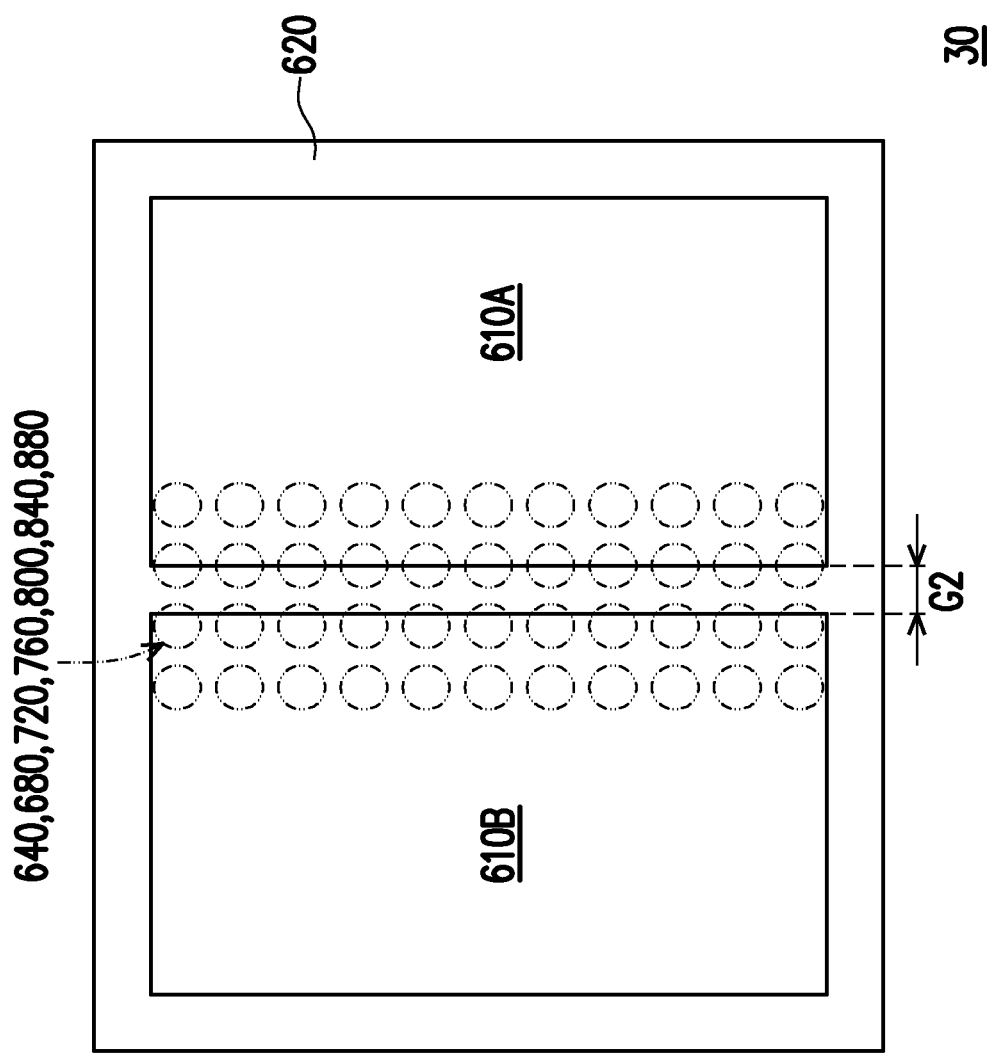
FIG. 5 is a schematic top view of a memory module according to some embodiments of the present disclosure.

FIG. 4 is a schematic cross-sectional view of a semiconductor package 35 according to some embodiments of the disclosure. In some embodiments, the semiconductor package 35 includes a memory module 30 connected to a logic die 600. FIG. 5 is a schematic top view of the memory module 30 according to some embodiments of the disclosure. Referring to FIG. 4 and FIG. 5, in some embodiments, the memory module 30 includes multiple tiers T1-T8 of stacked semiconductor chips 610, 650, 690, 730, 770, 810, 860, 890. In some embodiments, the memory module 30 may be manufactured starting from the (topmost) tier T1 following a similar process as described above with respect to the memory modules 10 and 20 (respectively shown in FIG. 1L and FIG. 3C). In some embodiments, the semiconductor chips 610A, 610B of the tier T1 are disposed closer to each other with respect to pairs of semiconductor chips included in the other tiers T2-T8. For example, the width WG2 of a gap G2 between the semiconductor chips 610A, 610B may be in the range from 60 μm to 620 μm, and be smaller than a distance between adjacent semiconductor chips 650 included in the underlying tier T2. In some embodiments, redistribution structures 630, 670, 710, 750, 790, 830, 870 are disposed between pairs of consecutive tiers T1-T8. A further redistribution structure 910 may be formed on the tier T8 on an opposite side with respect to the redistribution structure 870. In some embodiments, the tier T1 is referred to as a topmost tier, and the tiers T2-T8 are referred to as lower tiers. In some embodiments, the redistribution structure 630 is referred to as a topmost redistribution structure. TIVs 640, 680, 720, 760, 800, 840, 880 may be disposed between pairs of consecutive redistribution structures 630, 670, 710, 750, 790, 830, 870, 910, providing vertical interconnection between the redistribution structures of a given pair. For example, the TIVs 640 establish electrical connection between the redistribution structure 630 and the redistribution structure 670. Each tier T1-T8 may further include a corresponding encapsulant 620, 660, 700, 740, 780, 820, 860, 900. In some embodiments, the semiconductor chips and the TIVs of a given tier are encapsulated by the encapsulant of the given tier. For example, the semiconductor chips 650 and the TIVs 640 of the tier T2 are encapsulated by the encapsulant 660. In some embodiments, the TIVs 640, 680, 720, 760, 800, 840, 880 of the tiers T2-T8 are disposed in between the semiconductor chips 650, 690, 730, 770, 810, 850, 890 of the corresponding tier T2-T8, in an area vertically overlapping with the gap G2 between the semiconductor chips 610A, 610B of the tier T1. In some embodiments, the TIVs 640, 680, 720, 760, 800, 840, 880 of the tiers T2-T8 may also vertically overlap with the semiconductor chips 610A, 610B of the tier T1. That is, vertical projections of the TIVs 640, 680, 720, 760, 800, 840, 880 may fall on both sides of the gap G2 in between the semiconductor chips 610A, 610B. In some embodiments, the encapsulant 620 of the tier T1 fills the gap G2 in between the semiconductor chips 610A, 610B. In some embodiments, the width of the gap G2 may be selected as a function of the thickness T610 (the distance between the active surface 610*t* and the bottom surface 610*b*) of the semiconductor chips 610A, 610B. In some embodiments, the distance between the semiconductor chips 610A, 610B is selected to result in the gap G2 having an aspect ratio (a ratio of the thickness T610 to the width WG2) in the range from ~0.67 to ~11.15. In some embodiments, heat produced during usage of the memory module 30 converges towards an area of the tier T1 overlapping the TIVs 640, 680, 720, 760, 800, 840, 880 of the tiers T2-T8. In some embodiments, the area where the heat converges includes the gap G2 in between the semiconductor chips 610A, 610B as well as portions of the semiconductor chips 610A, 610B. In some embodiments, even though the encapsulant 630 extends through the area where the heat converges during usage, because the semiconductor chips 610A, 610B are also located in the area where the heat converges, heat dissipation can be ensured. That is, according to some embodiments, even when the gap G2 is filled by the encapsulant 430 satisfactory thermal performance of the memory module 30 can be achieved. In some embodiments, as the semiconductor chips 610A, 610B extends in the area where the heat converges during usage and the semiconductor chips 610A, 610B include semiconductor materials which are also thermally conductive materials, the thermal resistance of the memory module 30 may be reduced and heat dissipation may be enhanced. As such, increased reliability and lifetime of the memory module 30 may be achieved. In the semiconductor package 30, part of the semiconductor chips 610A may act as a first portion of thermally conductive material, and part of the semiconductor chip 610B may act as a second portion of thermally conductive material. That is, in the semiconductor package 30, the thermally conductive material providing heat dissipation for the heat migrating on top of the TIVs 640, 680, 720, 760, 800, 840, 880 during usage may comprise a first portion 6111A integrally formed with a semiconductor substrate 611A of the semiconductor chip 610A and a second portion 6111B integrally formed with a semiconductor substrate 611B of the semiconductor chip 610B. In some embodiments, the two portions 6111A, 6111B of the thermally conductive material are separated by the encapsulant 620.

In some embodiments, connective terminals 920 are disposed on the redistribution structure 910 and establish electrical connection with the logic die 600. In some embodiments, an underfill 925 may be formed between the memory module 30 and the logic die 600 to protect the electrical connection established by the connective terminals 920. In some embodiments, conductive terminals 640 may be disposed on an opposite side of the logic die 600 with respect to the memory module 30 to integrate the semiconductor package 35 within larger devices (not shown).

In some embodiments, a memory module may include multiple tiers of vertically stacked semiconductor dies electrically connected through interposed redistribution structures and TIVs. In some embodiments, during usage of the memory module, the heat produced may converge towards an upper tier in an area overlying the TIVs. In some embodiments, by including highly conductive material (e.g., having a thermal conductivity of at least 5 W/(K·m) in the area where the heat converges, the thermal performance of the memory module can be enhanced, the reliability can be increased, and the lifetime can be prolonged.

In accordance with some embodiments of the disclosure, a memory module includes a first redistribution structure, a second redistribution structure, first semiconductor dies, second semiconductor dies an encapsulant, through insulator vias and a thermally conductive material. The second redistribution structure is stacked over the first redistribution structure. The first semiconductor dies are sandwiched between the first redistribution structure and the second redistribution structure and are disposed side by side. The second semiconductor dies are disposed on the second redistribution structure. The encapsulant laterally wraps the second semiconductor dies. The through insulator vias are disposed among the first semiconductor dies, extending from the first redistribution structure to the second redistribution structure. The through insulator vias are electrically connected to the first redistribution structure and the second redistribution structure. The thermally conductive material is disposed on the second redistribution structure, among the second semiconductor dies and overlying the through insulator vias. The thermal conductivity of the thermally conductive material is larger than the thermal conductivity of the encapsulant.

In accordance with some embodiments of the disclosure, a semiconductor package is provided. The semiconductor package includes a logic die and a memory module. The memory module is disposed on the logic die and is electrically connected to the logic die. The memory module includes lower tiers, a topmost redistribution structure, and a topmost tier. The lower tiers are alternately stacked with redistribution structure. The lower tiers comprise first semiconductor dies, first encapsulants and through insulator vias. The first encapsulants wrap the first semiconductor dies. The through insulator vias are disposed in between the first semiconductor dies and extend through the first encapsulants. The topmost redistribution structure is disposed on the lower tiers. The topmost tier is disposed on the topmost redistribution structure. The topmost tier includes second semiconductor dies, a thermally conductive block, and a second encapsulant. The second semiconductor dies are separated by a distance and are disposed over the first semiconductor dies. The thermally conductive block fills the distance between the second semiconductor dies. The second encapsulant surrounds the second semiconductor dies and the thermally conductive block.

In accordance with some embodiments of the disclosure, a manufacturing method of a passive device module is provided. The method includes at least the following steps. First semiconductor dies are provided. A thermally conductive block is formed in between the first semiconductor dies. The first semiconductor dies and the thermally conductive block are molded in a first encapsulant. A first redistribution structure is formed on the first semiconductor dies, the thermally conductive block, and the first encapsulant. Second semiconductor dies are disposed on the first redistribution structure. First through insulator vias are formed in between the second semiconductor dies over the thermally conductive block. The second semiconductor dies and the first through insulator vias are laterally encapsulated with a second encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory module, comprising:
a first redistribution structure;
a second redistribution structure stacked over the first redistribution structure;
first semiconductor dies sandwiched between the first redistribution structure and the second redistribution structure and disposed side by side;
second semiconductor dies disposed on the second redistribution structure;
an encapsulant laterally wrapping the second semiconductor dies;
through insulator vias disposed among the first semiconductor dies, extending from the first redistribution structure to the second redistribution structure and electrically connected to the first redistribution structure and the second redistribution structure; and
a thermally conductive material disposed on the second redistribution structure, among the second semiconductor dies and overlying the through insulator vias,
wherein the thermally conductive material has a thermal conductivity larger than that of the encapsulant.

2. The memory module of claim 1, wherein the thermal conductivity of the thermally conductive material is at least 5 W/(K·m).

3. The memory module of claim 1, wherein the second semiconductor dies are vertically stacked with the first semiconductor dies.

4. The memory module of claim 1, wherein the thermally conductive material includes a silver paste.

5. The memory module of claim 1, wherein the second semiconductor dies have semiconductor substrates including a semiconductor material, and the thermally conductive material includes the same semiconductor material.

6. The memory module of claim 5, wherein the thermally conductive material is integrally formed with the semiconductor substrates.

7. The memory module of claim 5, wherein a first portion of the thermally conductive material is integrally formed with the semiconductor substrate of one second semiconductor die, a second portion of the thermally conductive material is integrally formed with the semiconductor substrate of another second semiconductor die, and the encapsulant extends between the first portion and the second portion.

8. A semiconductor package, comprising:
a logic die; and
a memory module disposed on and electrically connected to the logic die,
wherein the memory module comprises:
lower tiers alternately stacked with redistribution structures, the lower tiers including:
first semiconductor dies;
first encapsulants wrapping the first semiconductor dies; and
through insulator vias disposed in between the first semiconductor dies and extending through the first encapsulants;
a topmost redistribution structure disposed on the lower tiers; and
a topmost tier disposed on the topmost redistribution structure, the topmost tier including:
second semiconductor dies separated by a distance and disposed over the first semiconductor dies;
a thermally conductive block filling the distance between the second semiconductor dies; and
a second encapsulant surrounding the second semiconductor dies and the thermally conductive block.

9. The semiconductor package of claim 8, wherein a material of the thermally conductive block is different from a material of the second encapsulant.

10. The semiconductor package of claim 8, wherein the encapsulant has an annular shape.

11. The semiconductor package of claim 8, wherein three side surfaces of one second semiconductor die are covered by the second encapsulant and a fourth side surface of the one second semiconductor die is covered by the thermally conductive block.

12. The semiconductor package of claim 8, wherein the thermally conductive block vertically overlaps with the through insulator vias.

13. The semiconductor package of claim 8, further comprising a heat spreader disposed on the second semiconductor dies and the thermally conductive block.

14. The semiconductor package of claim 8, wherein die attach films are interposed between the first semiconductor dies and the overlying redistribution structures.

15. A manufacturing method of a memory module, comprising:
providing first semiconductor dies;
forming a thermally conductive block in between the first semiconductor dies;
molding the first semiconductor dies and the thermally conductive block in a first encapsulant;
forming a first redistribution structure on the first semiconductor dies, the thermally conductive block and the first encapsulant;
disposing second semiconductor dies on the first redistribution structure;
forming first through insulator vias in between the second semiconductor dies over the thermally conductive block;
laterally encapsulating the second semiconductor dies and the first through insulator vias with a second encapsulant.

16. The manufacturing method of claim 15, wherein forming the thermally conductive block comprises:
dispensing a thermal filler material in between the first semiconductor dies.

17. The manufacturing method of claim 16, wherein molding the first semiconductor dies comprises:

forming an encapsulating material covering the first semiconductor dies and the thermal filler material;

planarizing the encapsulating material until the first semiconductor dies are exposed.

18. The manufacturing method of claim 17, wherein a portion of the thermal filler material is removed during planarization of the encapsulating material.

19. The manufacturing method of claim 16, further comprising curing the thermal filler material.

20. The manufacturing method of claim 15, wherein the second semiconductor dies have contact pads formed on a top surface of a semiconductor substrate, and disposing the second semiconductor dies on the first redistributions structure comprises securing the second semiconductor dies to the first redistribution structure via die attach films disposed on a bottom surface of the semiconductor substrate.

* * * * *